United States Patent
You et al.

(10) Patent No.: US 9,711,504 B2
(45) Date of Patent: Jul. 18, 2017

(54) SEMICONDUCTOR DEVICE

(71) Applicant: Samsung Electronics Co., Ltd., Suwon-si, Gyeonggi-do (KR)

(72) Inventors: Jung-Gun You, Ansan-si (KR); Ki-Il Kim, Suwon-si (KR); Gi-Gwan Park, Suwon-si (KR); Sug-Hyun Sung, Yongin-si (KR); Myung-Yoon Um, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/155,744

(22) Filed: May 16, 2016

(65) Prior Publication Data

US 2017/0047326 A1    Feb. 16, 2017

(30) Foreign Application Priority Data

Aug. 11, 2015    (KR) .................. 10-2015-0113280

(51) Int. Cl.
*H01L 27/088* (2006.01)
*H01L 29/78* (2006.01)
*H01L 29/06* (2006.01)

(52) U.S. Cl.
CPC ...... *H01L 27/0886* (2013.01); *H01L 29/0649* (2013.01); *H01L 29/0657* (2013.01); *H01L 29/7851* (2013.01); *H01L 29/7853* (2013.01)

(58) Field of Classification Search
CPC ............. H01L 27/0886; H01L 27/0924; H01L 27/10826; H01L 27/10879; H01L 29/7855; H01L 2029/7858; H01L 2029/7856

See application file for complete search history.

(56) References Cited

U.S. PATENT DOCUMENTS

| | | | |
|---|---|---|---|
| 7,538,391 B2* | 5/2009 | Chidambarrao .... | H01L 29/0649 257/347 |
| 8,546,891 B2* | 10/2013 | Chang .................... | H01L 29/06 257/401 |
| 8,658,539 B2* | 2/2014 | Chang .................... | H01L 29/06 257/E29.255 |
| 8,729,634 B2* | 5/2014 | Shen .................. | H01L 29/66818 257/368 |
| 8,941,179 B2* | 1/2015 | Bergendahl ....... | H01L 21/76205 257/347 |
| 9,123,744 B1* | 9/2015 | Liao .................... | H01L 21/0262 |
| 9,343,370 B1* | 5/2016 | Lee .................... | H01L 21/3083 |
| 9,450,047 B1* | 9/2016 | Liao .................... | H01L 29/0847 |
| 9,455,198 B1* | 9/2016 | Yu .................... | H01L 21/823481 |

(Continued)

*Primary Examiner* — Earl Taylor
(74) *Attorney, Agent, or Firm* — Harness, Dickey & Pierce, P.L.C.

(57) ABSTRACT

A semiconductor device includes a substrate including a first trench, a first fin pattern on the substrate that is defined by the first trench, a gate electrode on the substrate, and a field insulating layer on the substrate. The first fin pattern includes an upper part on a lower part. The first fin pattern includes a first sidewall and a second sidewall opposite each other. The first sidewall is concave along the lower part of the first fin pattern. The second sidewall is tilted along the lower part of the first fin pattern. The field insulating layer surrounds the lower part of the first fin pattern. The gate electrode surrounds the upper part of the first fin pattern.

17 Claims, 27 Drawing Sheets

(56) References Cited

U.S. PATENT DOCUMENTS

| | | | |
|---|---|---|---|
| 2008/0173937 A1* | 7/2008 | Chung | H01L 29/0657 257/329 |
| 2013/0200455 A1* | 8/2013 | Lo | H01L 29/66795 257/347 |
| 2013/0224936 A1* | 8/2013 | Lee | H01L 21/823821 438/492 |
| 2014/0077303 A1* | 3/2014 | Baek | G06F 17/5063 257/365 |
| 2014/0131813 A1* | 5/2014 | Liaw | H01L 27/1104 257/401 |
| 2014/0312471 A1* | 10/2014 | Hong | H01L 29/06 257/632 |
| 2015/0001468 A1* | 1/2015 | Huang | H01L 29/66977 257/24 |
| 2015/0021672 A1* | 1/2015 | Chuang | H01L 21/28088 257/288 |
| 2015/0031182 A1* | 1/2015 | Perng | H01L 29/165 438/283 |
| 2015/0035017 A1* | 2/2015 | Wann | H01L 29/785 257/288 |
| 2015/0048454 A1* | 2/2015 | Colinge | H01L 29/785 257/347 |
| 2015/0061040 A1* | 3/2015 | Bergendahl | H01L 29/7855 257/401 |
| 2015/0069474 A1* | 3/2015 | Ching | H01L 29/7842 257/288 |
| 2015/0076558 A1* | 3/2015 | Lee | H01L 29/16 257/190 |
| 2015/0076654 A1* | 3/2015 | Ganz | H01L 21/76 257/506 |
| 2015/0115363 A1* | 4/2015 | Chang | H01L 21/823431 257/347 |
| 2015/0380241 A1* | 12/2015 | Yu | H01L 29/785 257/401 |
| 2016/0027684 A1* | 1/2016 | Chang | H01L 21/76235 257/401 |
| 2016/0190131 A1* | 6/2016 | You | H01L 27/0886 257/401 |
| 2016/0204106 A1* | 7/2016 | You | H01L 27/0886 257/401 |
| 2016/0211254 A1* | 7/2016 | Kang | H01L 27/0266 |
| 2016/0211379 A1* | 7/2016 | You | H01L 29/0649 |
| 2016/0218180 A1* | 7/2016 | You | H01L 29/6681 |
| 2016/0260715 A1* | 9/2016 | Chung | H01L 29/1095 |
| 2016/0268399 A1* | 9/2016 | Akarvardar | H01L 29/66795 |
| 2016/0308058 A1* | 10/2016 | Cheng | H01L 29/7853 |
| 2016/0315172 A1* | 10/2016 | Wu | H01L 29/66636 |
| 2016/0315193 A1* | 10/2016 | Kim | H01L 29/7848 |

* cited by examiner

SEMICONDUCTOR DEVICE

CROSS-REFERENCE TO RELATED APPLICATION

This application claims priority under 35 U.S.C. §119 to Korean Patent Application No. 10-2015-0113280, filed on Aug. 11, 2015 in the Korean Intellectual Property Office. The entire contents of which are herein incorporated by reference.

BACKGROUND

1. Field

The present disclosure relates to a semiconductor device.

2. Description of Related Art

As one of the scaling techniques for increasing the density of a semiconductor device, a multi-gate transistor has been suggested. The multi-gate transistor is obtained by forming a fin-shaped silicon body on a substrate and forming a gate on the surface of the silicon body.

The multi-gate transistor can be scaled because it uses a three-dimensional (3D) channel. In addition, the current control capability can be improved without the need to increase the gate length of the multi-gate transistor. Moreover, it is possible to effectively limit and/or suppress a short channel effect (SCE) in which an electric potential of a channel region is affected by a drain voltage.

SUMMARY

Inventive concepts relate to a semiconductor device whose performance can be improved by increasing a width effect through the adjustment of the channel shape of a fin-shaped field effect transistor (FinFET).

According to example embodiments of inventive concepts, a semiconductor device includes a substrate including a first trench, a first fin pattern on the substrate, a gate electrode on the substrate, and a field insulating layer on the substrate surrounding part of the first fin pattern. The first fin pattern includes a first sidewall and a second sidewall facing each other. The first fin pattern is defined by the first trench. The first fin pattern includes an upper part on a lower part. A first boundary line divides the lower part and the upper part of the first fin pattern. A first fin central line is orthogonal to the first boundary line and meets a higher part of the upper part of the first fin pattern. A first distance between the first sidewall and the first fin central line is measured at a first height from a lower surface of the first trench. A second distance between the first sidewall and the first fin central line is measured at a second height lower than the first height. The first distance is greater than the second distance. The gate electrode intersects the first fin pattern. The upper part of the first fin pattern is surrounded by the gate electrode. The lower part of the first fin pattern is surrounded by the field insulating layer.

In example embodiments, a third distance between the second sidewall and the first fin central line may be measured at the first height, a fourth distance between the second sidewall and the first fin central line may be measured at the second height, and the third distance may be smaller than the fourth distance.

In example embodiments, the first height and the second height may be lower than a height from the lower surface of the first trench to the first boundary line, and the first distance and the second distance may be smaller than a third distance between the first sidewall and the first fin central line that is measured on the first boundary line.

In example embodiments, a distance between the first fin central line and the first sidewall of the upper part of the first fin pattern may be reduced as a distance from the first boundary line increases.

In example embodiments, the first fin central line may contact the first sidewall.

In example embodiments, the semiconductor device may further include a protrusion structure that protrudes from a bottom surface of the first trench adjacent to the first sidewall.

In example embodiments, the first trench may include a first sub-trench and a second sub-trench. The first sub-trench may contact the first sidewall. The second sub-trench may contact the second sidewall. An upper surface of the first sub-trench may be in a different plane from an upper surface of the second sub-trench.

In example embodiments, a height of the first sub-trench from the substrate may be lower than that of the second sub-trench.

In example embodiments, the semiconductor device may further include a liner that surrounds the lower part of the first fin pattern.

In example embodiments, the semiconductor device may further include a second fin pattern on the substrate adjacent to the first trench. The second fin pattern may include a third sidewall and a fourth sidewall facing each other. The substrate may include a second trench adjacent to the first sidewall of the first fin pattern and the fourth sidewall of the second fin pattern. The field insulating layer may fill part of the first trench and part of the second trench. The second fin pattern may include an upper part on a lower part. The lower part of the second fin pattern may be surrounded by the field insulating layer. The upper part of the second fin pattern may be surrounded by the gate electrode. The second fin pattern may include a second boundary line that divides the lower part and the upper part of the second fin pattern. The second fin pattern may include a second fin central line that is orthogonal to the second boundary line and meets a highest part of the upper part of the second fin pattern. A third distance between the fourth sidewall and the second fin central line may be measured at the first height. A fourth distance between the fourth sidewall and the second fin central line may be measured at the second height. The third distance may be greater than the fourth distance.

In example embodiments, a field central line may be defined between the first fin central line and the second fin central line and at a location separated from the first fin central line and the second fin central line by equal distances, wherein the second sidewall and the third sidewall may be symmetrical to each other with respect to the field central line.

In example embodiments, the first fin pattern and the second fin pattern may be defined by the first trench, and a first depth of the first trench may be smaller than or equal to a second depth of the second trench.

In example embodiments, the second trench may define an active region.

In example embodiments, the semiconductor device may further include a third fin pattern on the substrate between the first fin pattern and the second fin pattern. The third fin pattern may be defined by the first trench.

In example embodiments, the third fin pattern may include a fifth sidewall and a sixth sidewall that face each other. The third fin pattern may include an upper part on a lower part. The lower part of the third fin pattern may be surrounded by the field insulating layer. The upper part of the third fin pattern may be surrounded by the gate electrode. The third fin pattern may include a third boundary line that divides the lower part and the upper part of the third fin pattern. The third fin pattern may include a third fin central line that is orthogonal to the third boundary line and meets a highest part of the upper part of the third fin pattern. The fifth sidewall and the sixth sidewall may be symmetrical to each other with respect to the third fin central line.

In example embodiments, the semiconductor device may further include a second fin pattern on the substrate. The second fin pattern may include a third sidewall and a fourth sidewall facing each other. The second fin pattern may include an upper part on a lower part. The lower part of the second fin pattern may be surrounded by the field insulating layer. The upper part of the second fin pattern may be surrounded by the gate electrode. The second fin may include a second boundary line between the lower part of the second fin pattern and the upper part of the second fin pattern. The second fin pattern may include a second fin central line that is orthogonal to the second boundary line and meets a highest part of the upper part of the second fin pattern. The third sidewall and the fourth sidewall may be symmetrical to each other with respect to the second fin central line.

According to example embodiments of inventive concepts, a semiconductor device includes a first fin pattern including a first sidewall and a second sidewall facing each other, a gate electrode on the first fin pattern, and a field insulating layer contacting part of the first fin pattern. The first fin pattern includes an upper part on a lower part. The first fin pattern includes a first boundary line that divides the lower part and the upper part. The first fin pattern includes a first fin central line that is orthogonal to the first boundary line and meets a highest part of the upper part of the first fin pattern. A first line is parallel to the first fin central line and contacts a first point. A second line is parallel to the first fin central line and contacts a second point. The second line is closer to the first fin central line than the first line and the second point is located under the first point. The gate electrode intersects the first fin pattern. The field insulating layer surrounds the lower part of the first fin pattern.

In example embodiments, the second line may be closer to the first fin central line than the first line.

In example embodiments, the first fin central line and the first line may overlap each other.

In example embodiments, the first fin central line may be located further outwards of the first fin pattern than the first line and the second line.

In example embodiments, the semiconductor device may further include a substrate including a first trench that defines the first fin pattern, and a protrusion structure that protrudes from a bottom surface of the first trench adjacent to the first sidewall.

In example embodiments, the semiconductor device may further include a substrate including a first trench, and a second fin pattern including a third sidewall and a fourth sidewall facing each other. The first pattern may be defined by the first trench. The second fin pattern may be adjacent to the first fin pattern. The first trench may be between the second sidewall of the first fin pattern and the third sidewall of the second fin pattern which face each other. The second fin pattern may include an upper part on a lower part. The field insulating layer may surround the lower part of the second fin pattern. The gate electrode may surround the upper part of the second fin pattern. A second boundary line may divide the upper and lower parts of the second fin pattern. A second fin central line may be orthogonal to the second boundary line and may meet a highest part of the upper part of the second fin pattern. A third line may be parallel to the second fin central line and may contact a third point. A fourth line may be parallel to the second fin central line and may contact a fourth point. The third line may be closer to the second fin central line than the fourth line. The fourth point may be located under the third point.

In example embodiments, the second sidewall of the first fin pattern and the third sidewall of the second fin pattern may face each other with the field insulating layer therebetween. A field central line may be defined between the first fin central line and the second fin central line and at a location separated from the first fin central line and the second fin central line by equal distances. The second sidewall and the third sidewall may be symmetrical to each other with respect to the field central line.

In example embodiments, the second line and the fourth line may be located at equal distances from the field central line.

According to example embodiments of inventive concept, a semiconductor device includes a first fin pattern, a second fin pattern adjacent to the first fin pattern, a substrate including a trench between the first fin pattern and the second fin pattern, a third fin pattern adjacent to the second fin pattern, a gate electrode on the first through third fin patterns, and a field insulating layer that contacts part of each of the first through third fin patterns. The first fin pattern includes a first sidewall and a second sidewall facing each other. The first fin pattern includes an upper part on a lower part, a first boundary line which divides the lower part and the upper part of the first fin pattern, and a first fin central line which is orthogonal to the first boundary line and meets a highest part of the upper part of the first fin pattern. A first distance between the first sidewall and the first fin central line is measured at a first height from a lower surface of the trench. A second distance between the first sidewall and the first fin central line is measured at a second height lower than the first height. The first distance is greater than the second distance. A first gap is between a second fin central line which is parallel to the first fin central line and meets a highest part of the second fin pattern and the first fin central line is different from a second gap between a third fin central line which is parallel to the first fin central line and meets a highest part of the third fin pattern and the second fin central line. The gate electrode intersects the first through third patterns. The gate electrode surrounds the upper part of the first fin pattern. The field insulating layer surrounds the lower part of the first fin pattern.

In example embodiments, the second fin pattern may include an upper part on a lower part. The field insulating layer may surround the upper part of the second fin pattern. The gate electrode may surround the upper part of the second fin pattern. The third fin pattern may include a lower part which is surrounded by the field insulating layer and an upper part which is surrounded by the gate electrode. A first area between the upper part of the first fin pattern and the upper part of the second fin pattern may be different from a second area between the upper part of the second fin pattern and the upper part of the third fin pattern.

In example embodiments, the first gap may be greater than the second gap, and the first area may be larger than the second area.

In example embodiments, the first gap may be smaller than the second gap, and the first area may be smaller than the second area.

In example embodiments, a first point and a second point on the first sidewall may meet a straight line parallel to the first fin central line. The second point may be located under the first point and may be closer to the first fin central line than the first point.

In example embodiments, the semiconductor device may further include a first line which may pass through the first point and may be parallel to the first fin central line, and a second line which may pass through the second point and may be parallel to the first fin central line. The second line may be closer to the first fin central line than the first line.

In example embodiments, the semiconductor device may further include a first line which may pass through the first point and may be parallel to the first fin central line, and a second line which may pass through the second point and may be parallel to the first fin central line, wherein the first fin central line may be between the first line and the second line.

In example embodiments, a height of the first fin pattern may be different from that of the second or third fin patterns.

According to example embodiments of inventive concepts, a semiconductor device includes a substrate, a first gate electrode, and a field insulating layer. The substrate includes a first trench, a second trench, and a third trench. The first trench has a first depth. The first trench defines a first active region and a second active region that are separated from each other. The second trench defines a first fin pattern in the first active region. The first fin pattern includes a first sidewall and a second sidewall that face each other. The first fin pattern includes an upper part on a lower part and a first boundary line that divides the lower part and the upper part of the first fin pattern. The first fin pattern is defined by a first fin central line that is orthogonal to the first boundary line and meets a highest part of the upper part of the first fin pattern, a first line that is parallel to the first fin central line and contacts a first point, and a second line that is parallel to the first fin central line and contacts a second point. The second line is closer to the first fin central line than the first line. The second point is located under the first point. The second trench has a second depth that is smaller than the first depth. The third trench defines a second fin pattern in the second active region. The third trench has a third depth that is smaller than the first depth. The first gate electrode is on the first and second fin patterns. The first gate electrode intersects the first and second fin patterns. The first gate electrode surrounds the upper part of the first fin pattern. The field insulating layer fills part of the first trench, part of the second trench, and part of the third trench. The first insulating layer surrounds the lower part of the first fin pattern.

In example embodiments, the semiconductor device may further include a second gate electrode on the substrate. The substrate may include a fourth trench, a fifth trench, and a sixth trench. The fourth trench may have a fourth depth and may define a third active region and a fourth active region separated from each other. The fifth trench may define a third fin pattern in the third active region and may have a fifth depth smaller than the fourth depth. The sixth trench may define a fourth fin pattern in the fourth active region and may have a sixth depth smaller than the fourth depth. The second gate electrode may intersect the third and fourth fin patterns. The third fin pattern may include a third sidewall and a fourth sidewall which face each other, a lower part which may be surrounded by the field insulating layer, an upper part which may be surrounded by the second gate electrode, a second boundary line which may divide the lower part and the upper part of the third fin pattern, a third fin central line which may be orthogonal to the second boundary line and may meet a highest part of the upper part of the third fin pattern, a third line which may be parallel to the third fin central line and contacts a third point, and a fourth line which may be parallel to the third fin central line and may contact a fourth point. The fourth fin pattern may be symmetrical to the third fin pattern with respect to a second field central line located at a center of the fourth trench.

In example embodiments, a first gap between the first line and the second line may be different from a second gap between the third line and the fourth line.

In example embodiments, a third gap between the first fin pattern and the second fin pattern may be greater than a fourth gap between the third fin pattern and the fourth fin pattern, and the first gap may be greater than the second gap.

In example embodiments, the first fin pattern and the second fin pattern may be most adjacent to the first trench.

According to example embodiments of inventive concepts, a semiconductor device includes a substrate including a first trench, a first fin pattern on the substrate and being defined by the first trench, a field insulating layer on the substrate, and a gate electrode on the substrate. The first fin pattern includes an upper part on a lower part. The first fin pattern includes a first sidewall and a second sidewall opposite each other. The first sidewall is concave along the lower part of the first fin pattern. The second sidewall is tilted along the lower part of the first fin pattern. The field insulating layer surrounds the lower part of the first fin pattern. The gate electrode surrounds the upper part of the first fin pattern.

In example embodiments, the upper part and lower part of the first fin pattern may be defined based on a horizontal distance between a first fin central line and the first and second sidewalls of the first fin pattern, a first point along the first sidewall, and a second point along the first sidewall. The first fin central line may extend vertically from a highest part of the first fin pattern to a lowest part of the first fin. The first point may be along the first sidewall between the highest part of the first fin pattern and the second point. The second point may be along the first sidewall between the first point and a lowest part of the first fin pattern. The horizontal distance between the first fin central line and the first sidewall may decrease along the first sidewall from the first point to the highest part of the first fin pattern. The horizontal distance between the first fin central line and the first sidewall may increase along the first sidewall from the second point to the first point. The horizontal distance between the first fin central line and the first sidewall may increase along the first sidewall from the second point to the lowest part of the first fin pattern.

In example embodiments, the substrate may include a deep trench that defines an active pattern. The first trench may be formed in the active pattern such that the first trench may define the first fin on the active pattern. An upper surface of the active pattern at a bottom of the first trench may be above a bottom surface of the deep trench.

In example embodiments, the first trench may define a plurality of fin patterns spaced apart from each other on the active pattern. The plurality of fin patterns may include an outer fin pattern spaced apart from the first fin pattern. The plurality of fin patterns may include the first fin pattern. The outer fin pattern may be symmetrical to the first fin pattern with respect to a first field central line that divides the active pattern and extends vertically through the active pattern.

In example embodiments, the plurality of fin patterns may include an interior fin pattern between the first fin pattern and the outer fin pattern. The interior fin pattern may include an upper part on a lower part. The upper part of the interior fin pattern may be at a same height as the upper part of the first fin pattern. A sidewall of the interior fin pattern may be not concave in the lower part of the interior fin pattern.

BRIEF DESCRIPTION OF THE DRAWINGS

The above and other aspects and features of inventive concepts will become more apparent by describing non-limiting embodiments thereof with reference to the attached drawings, in which:

FIG. 4b is an enlarged view of a portion of FIG. 4a;

DETAILED DESCRIPTION OF EXAMPLE EMBODIMENTS

Figure 1:
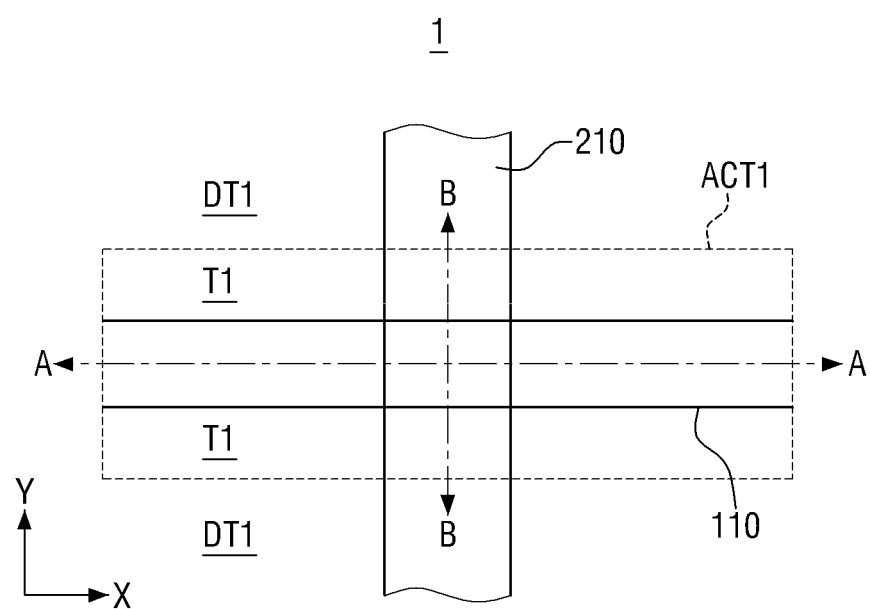
FIG. 1 is a layout view of a semiconductor device according to example embodiments of inventive concepts.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thickness of layers and regions are exaggerated for clarity. Like reference characters and/or numerals in the drawings denote like elements, and thus their description may not be repeated.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Other words used to describe the relationship between elements or layers should be interpreted in a like fashion (e.g., "between" versus "directly between," "adjacent" versus "directly adjacent," "connected" versus "directly connected"). As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (e.g., meaning "including, but not limited to,") unless otherwise noted. Expressions such as "at least one of," when preceding a list of elements, modify the entire list of elements and do not modify the individual elements of the list.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of example embodiments.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless defined otherwise, all technical and scientific terms used herein have the same meaning as commonly understood by one of ordinary skill in the art to example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
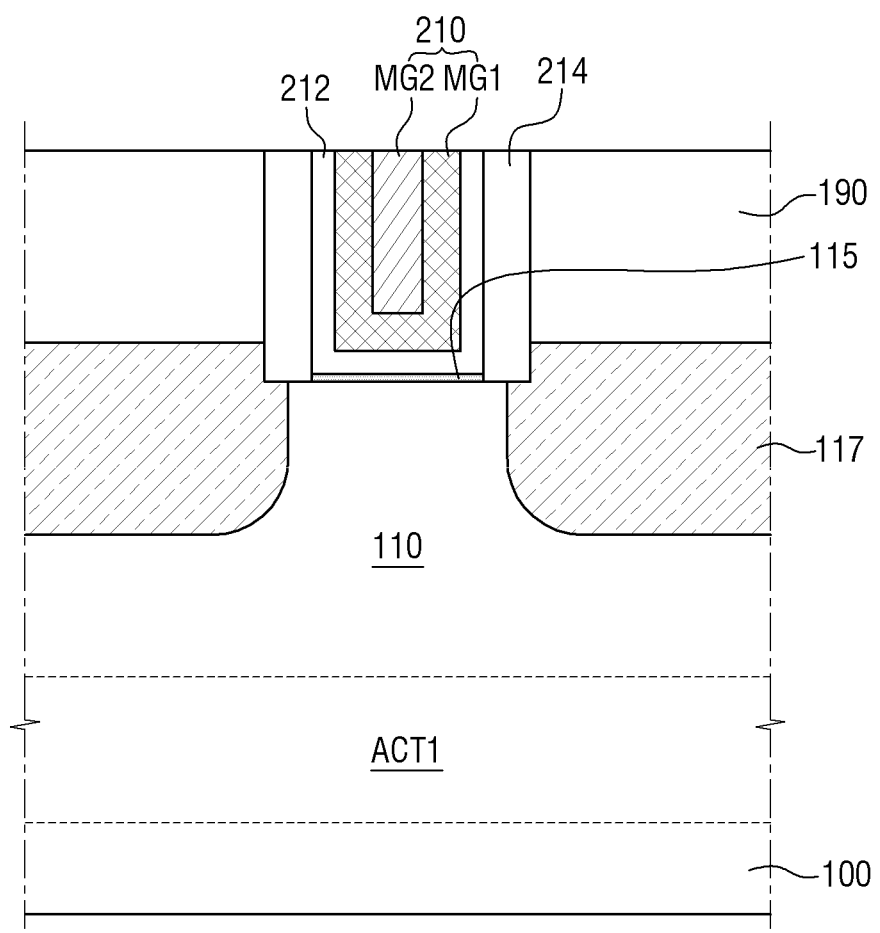
FIG. 2 is a cross-sectional view taken along the line A-A of FIG. 1.
Figure 3:
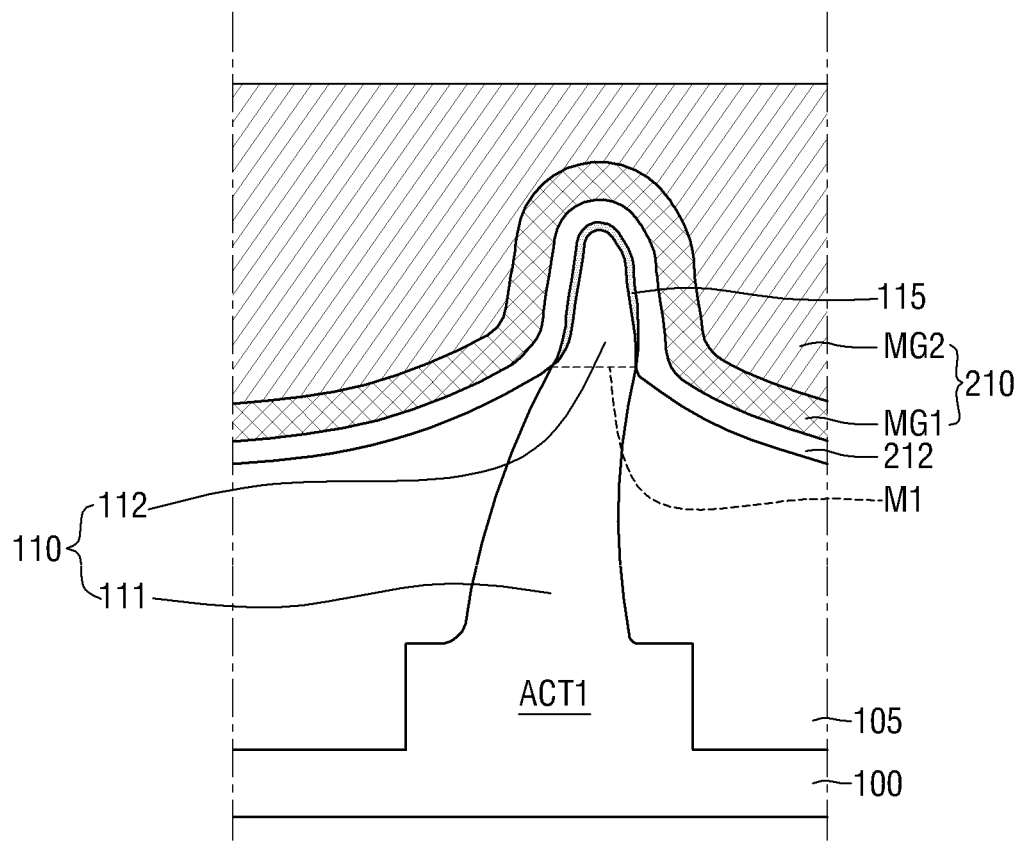
FIG. 3 is a cross-sectional view taken along the line B-B of FIG. 1.
Figure 4A:
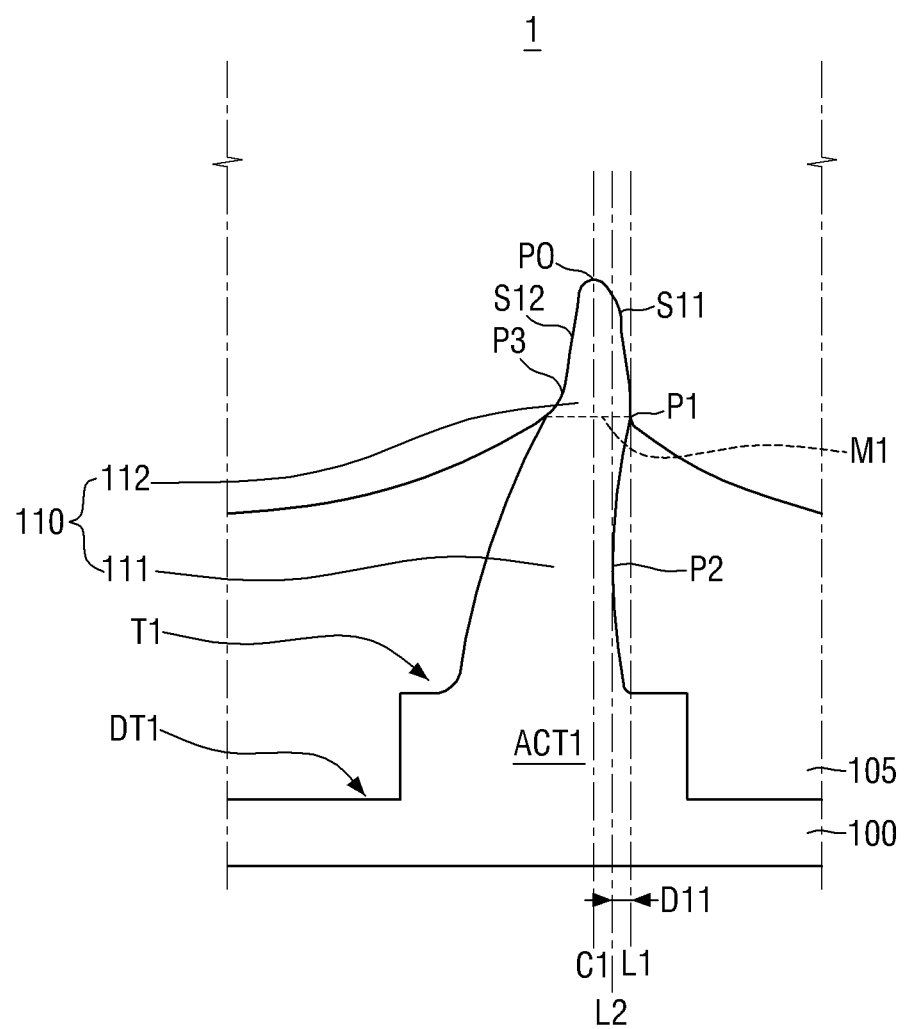
FIG. 4a is FIG. 3 without a gate electrode.
Figure 4B:
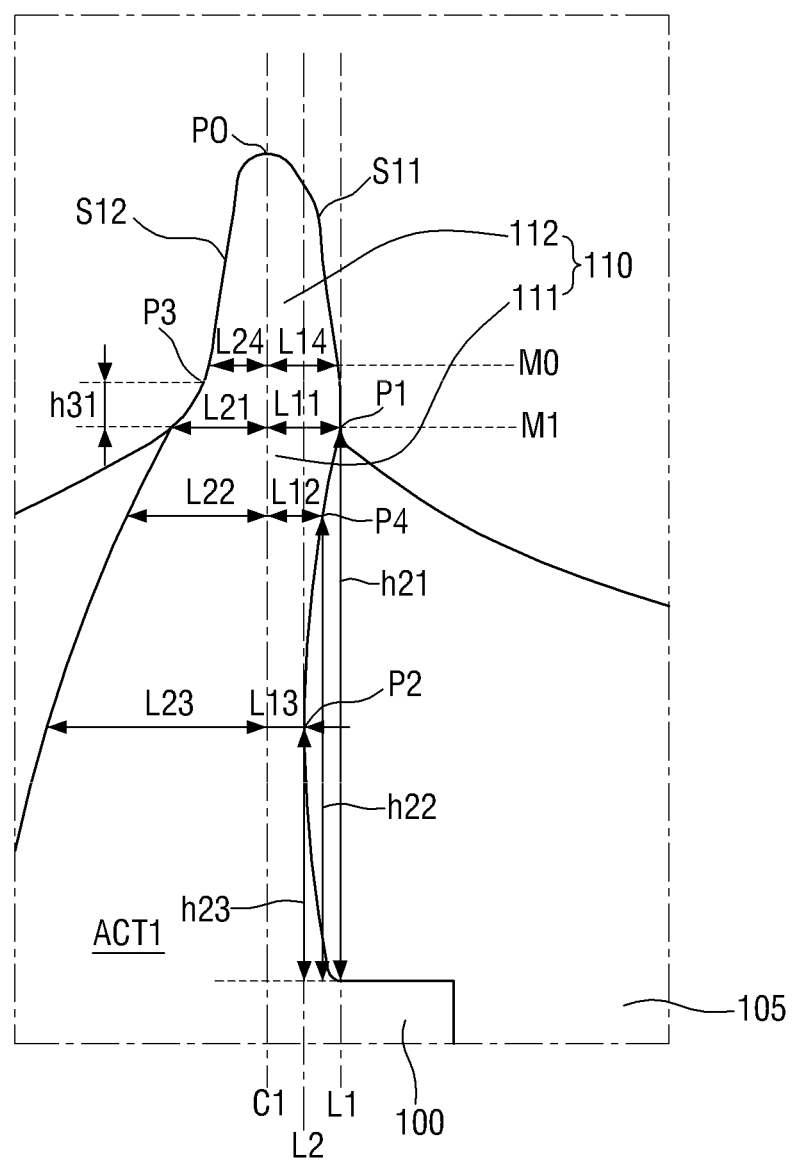

FIG. 1 is a layout view of a semiconductor device 1 according to example embodiments of inventive concepts. FIG. 2 is a cross-sectional view taken along the line A-A of FIG. 1. FIG. 3 is a cross-sectional view taken along the line B-B of FIG. 1. FIG. 4a is FIG. 3 without a gate electrode 210. FIG. 4b is an enlarged view of a portion of FIG. 4a.

Referring to FIGS. 1 through 4b, the semiconductor device 1 according to example embodiments may include a substrate 100, a first fin pattern 110, and the gate electrode 210.

The first fin pattern 110 may be formed in a first active region ACT1 of the substrate 100. The first fin pattern 110 may extend along a first direction X.

The substrate 100 may be a semiconductor or semiconductor-on-insulator substrate. For example, the substrate 100 may be a silicon substrate, a bulk silicon substrate, or a silicon-on-insulator (SOI) substrate. Otherwise, the substrate 100 may contain an element semiconductor such as germanium or a compound semiconductor such as a group IV-IV compound semiconductor or a group III-V compound semiconductor. Alternatively, the substrate 100 may consist of a base substrate and an epitaxial layer formed on the base substrate.

The group IV-IV compound semiconductor may be, for example, a binary or ternary compound containing two or more of carbon (C), silicon (Si), germanium (Ge) and tin (Sn) or a compound obtained by doping the binary or ternary compound with a group IV element.

The group III-V compound semiconductor may be, for example, a binary, ternary, or quaternary compound composed of at least one of aluminum (Al), gallium (Ga) and indium (In) (e.g., group III elements) bonded with one of phosphorus (P), arsenic (As) and antimony (Sb) (e.g., group V elements).

In the semiconductor device 1 according to example embodiments of inventive concepts, the first fin pattern 110 is described as a silicon fin active pattern that contains silicon.

In the drawings, the first fin pattern 110 is rectangular. However, the shape of the first fin pattern 110 is not limited to the rectangular shape. When the first fin pattern 110 is rectangular, it may include long sides and short sides.

A field insulating layer 105 may be formed on the substrate 100 and disposed around the first fin pattern 110. The field insulating layer 105 may surround part of the first fin pattern 110. The first fin pattern 110 may be defined by the field insulating layer 105.

The field insulating layer 105 may be, for example, an oxide layer, a nitride layer, an oxynitride layer, or a combination of these layers. The field insulating layer 105 may have, but not limited to, a shallow trench isolation (STI) structure which has superior device isolation properties and is advantageous for high-density integration because it occupies a small area.

The first fin pattern 110 and the field insulating layer 105 will be described in greater detail later with reference to FIG. 4b.

The gate electrode 210 may extend along a second direction Y to intersect the first fin pattern 110. The gate electrode 210 may be disposed on the first fin pattern 110 and the field insulating layer 105.

The gate electrode 210 may include metal layers (MG1, MG2). As illustrated in the drawings, the gate electrode 210 may be formed by stacking two or more metal layers (MG1, MG2). A first metal layer MG1 may control a work function, and a second metal layer MG2 may fill a space formed by the first metal layer MG1. For example, the first metal layer MG1 may contain at least one of, but not limited to, TiN, WN, TiAl, TiAlN, TaN, TiC, TaC, TaCN, TaSiN, and combinations of the same. In addition, the second metal layer MG2 may contain at least one of, but not limited to, W, Al, Cu, Co, Ti, Ta, poly-Si, SiGe, and metal alloys. The gate electrode 210 may be formed by, but not limited to, a replacement process (or a gate last process).

A gate insulating layer (115, 212) may be formed between the first fin pattern 110 and the gate electrode 210. The gate insulating layer (115, 212) may include an interface layer 115 and a high-k insulating layer 212.

The interface layer 115 may be formed by partially oxidizing the first fin pattern 110. The interface layer 115 may be formed along the profile of the first fin pattern 110 which protrudes further upward than an upper surface of the field insulating layer 105. When the first fin pattern 110 is a silicon fin pattern that contains silicon, the interface layer 115 may include a silicon oxide layer.

The high-k insulating layer 212 may be formed between the interface layer 115 and the gate electrode 210. The high-k insulating layer 212 may be formed along the profile of the first fin pattern 110 which protrudes further upward than the upper surface of the field insulating layer 105. In addition, the high-k insulating layer 212 may be formed between the gate electrode 210 and the field insulating layer 105.

The high-k insulating layer 212 may contain one or more of, but not limited to, silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Spacers 214 may be disposed on sidewalls of the gate electrode 210 extending along the second direction Y. The spacers 214 may contain at least one of silicon nitride (SiN), silicon oxynitride (SiON), silicon oxide ($SiO_2$), silicon oxycarbonitride (SiOCN), and combinations of the same. In FIG. 2, one side surface of each of the spacers 214 is illustrated as a straight line. However, the shape of each of the spacers 214 is not limited to the shape illustrated in FIG. 2 and can be changed to a different shape. For example, in example embodiments, the spacers 214 may be curved or 'L'-shaped.

Source or drain regions 117 may be formed on the first fin pattern 110 on both sides of the gate electrode 210. The source or drain regions 117 may be formed by an epitaxial process. The source or drain regions 117 may be, for example, elevated source or drain regions. Here, lower parts of the source or drain regions 117 may be rounded as illustrated in FIG. 2, but inventive concepts are not limited thereto.

When the semiconductor device 1 according to example embodiments is a p-channel metal oxide semiconductor (PMOS) transistor, the source or drain regions 117 may contain a compressive stress material. In an example, the compressive stress material may be a material (e.g., SiGe) having a greater lattice constant than Si. The compressive stress material can improve the mobility of carriers in a channel region by applying compressive stress to the first fin pattern 110.

On the other hand, when the semiconductor device according to example embodiments is an n-channel metal oxide semiconductor (NMOS) transistor, the source or drain regions 117 may contain a tensile stress material. In an example, when the first fin pattern 110 is Si, the source or drain regions 117 may be a material (e.g., SiC) having a smaller lattice constant than Si. The tensile stress material can improve the mobility of carriers in the channel region by applying tensile stress to the first fin pattern 110. A gap fill insulating layer 190 may be formed on the source or drain regions 1170. The gap fill insulating layer 190 may contact sides of the spacers 214. The gap fill insulating layer 190 may be formed of an oxide, such as silicon oxide, but inventive concepts are not limited thereto.

Referring to FIG. 3, the first fin pattern 110 may include an upper part 112 and a lower part 111. The first fin pattern 110 may be defined by a first shallow trench T1 of a first depth and a first deep trench DT1 of a second depth which is deeper than the first shallow trench T1.

In the semiconductor device 1 according to example embodiments of inventive concepts, the first shallow trench T1 and the first deep trench DT1 may be disposed on both sides of the first fin pattern 110.

Here, the first shallow trench T1 and the first deep trench DT1 may be disposed immediately adjacent to each other. Here, when the first shallow trench T1 and the first deep trench DT1 are immediately adjacent to each other, no shallow trench of the first depth is disposed between the first deep trench DT1 and the first shallow trench T1.

The field insulating layer 105 may fill part of the first shallow trench T1 and part of the first deep trench DT1.

In the drawings to be described below, the gate electrode 210 and the gate insulating layer (115, 212) are excluded for ease of description.

Referring to FIG. 4a, the first fin pattern 110 of the semiconductor device 1 according to example embodiments may include a first sidewall S11 and a second sidewall S12 that face each other. The first fin pattern 110 may include the upper part 112 and the lower part 111. In addition, the first fin pattern 110 may include a first boundary line M1 between the upper part 112 of the first fin pattern 110 and the lower part 111 of the first fin pattern 110. The sidewall of the lower part 111 of the first fin pattern 110 may be tilted (and/or convex) at point P2 along the first sidewall S11 and concave along the second sidewall S12.

The field insulating layer 105 may contact part of the first fin pattern 110. The lower part 111 of the first fin pattern 110 may be surrounded by the field insulating layer 105, and the upper part 112 of the first fin pattern 110 may be surrounded by the gate electrode 210.

The first boundary line M1 may be a boundary between the lower part 111 of the first fin pattern 110 which contacts the field insulating layer 105 and the upper part 112 of the first fin pattern 110 which does not contact the field insulating layer 105. In addition, the first boundary line M1 may be a line that connects points at which the field insulating layer 105 meets the first sidewall S11 and the second sidewall S12.

In addition, the first fin pattern 110 may include a first fin central line C1 which is orthogonal to the first boundary line M1 and meets a highest part P0 of the first fin pattern 110. That is, the first fin central line C1 may meet the highest part P0 of the upper part 112 of the first fin pattern 110.

Here, the highest part P0 of the first fin pattern 110 may be a point at which a moving line parallel to the first boundary line M1 last meets the first fin pattern 110. In addition, when the highest part P0 of the first fin pattern 110 forms a plane, it may be a middle point of the plane.

The first fin pattern 110 may be bent to one side. For example, the first sidewall S11 of the first fin pattern 110 may be bent in an 'S' shape, but inventive concepts are not limited thereto.

The first fin pattern 110 may include a first point P1 and a second point P2 on the first sidewall S11 which meet a straight line parallel to the first fin central line C1. Specifically, when the first fin central line C1 is moved outwards of the first fin pattern 110 in parallel, points at which the first fin central line C1 meets the first sidewall S11 may be the first point P1 and the second point P2.

The first point P1 may be located further outwards of the first fin pattern 110 than the second point P2. In addition, the second point P2 may be located under the first point P1 and closer to the first fin central line C1 than the first point P1.

Here, a first line L1 and a second line L2 parallel to the first fin central line C1 can be drawn. The first line L1 may pass through the first point P1, and the second line L2 may pass through the second point P2. The first line L1 and the second line L2 may be perpendicular to the first boundary line M1.

The second line L2 may be located closer to the first fin central line C1 than the first line L1. Accordingly, a lower part of the first sidewall S11 of the first fin pattern 110 may be located closer to the first fin central line C1 than the first point P1, but inventive concepts are not limited thereto.

In addition, the first line L1 and the second line L2 may be separated by a distance D11. As the distance D11 between the first line L1 and the second line L2 increases, the first sidewall S11 may be bent more.

Referring to FIG. 4b, in the semiconductor device 1 according to example embodiments, the first sidewall S11 and the second sidewall S12 of the first fin pattern 110 may be asymmetrical to each other with respect to the first fin central line C1. For example, the first sidewall S11 of the upper part 112 of the first fin pattern 110 may be asymmetrical to the second sidewall S12 of the upper part 112 of the first fin pattern 110 with respect to the first fin central line C1.

Here, the asymmetrical first fin pattern 110 can be defined as follows.

A first distance L12 between the first sidewall S11 and the first fin central line C1 which is measured at a first height h22 from a lower surface of the first shallow trench T1 may be greater than a second distance L13 between the first sidewall S11 and the first fin central line C1 which is measured at a second height h23 lower than the first height h22. Here, the first height h22 and the second height h23 may be lower than a height of the first boundary line M1.

Here, the first distance L12 and the second distance L13 may be smaller than a distance L11 between the first sidewall S11 and the first fin central line C1 which is measured on the first boundary line M1. A distance L21 may be between the first fin central line C1 and the second sidewall S12, which is measured on the first boundary line M1.

In addition, a distance L22 between the second sidewall S12 and the first fin central line C1 which is measured at the first height h22 may be smaller than a distance L23 between the second sidewall S12 and the first fin central line C1 which is measured at the second height h23 lower than the first height h22.

In addition, a distance between the first fin central line C1 and the first sidewall S11 of the upper part 112 of the first fin pattern 110 may be reduced as the distance from the first boundary line M1 increases. That is, the distance L11 between the first sidewall S11 and the first fin central line C1 which is measured on the first boundary line M1 may be greater than a distance L14 between the first sidewall S11 and the first fin central line C1 which is measured on a line M0 which is parallel to the first boundary line M1 and traverses the upper part 112 of the first fin pattern 110. Here, a distance L24 between the second sidewall S12 and the first fin central line C1 which is measured on the line M0 may be smaller than the distance L14 between the first sidewall S11 and the first fin central line C1, but inventive concepts are not limited thereto.

In addition, the distance L22 between the second sidewall S12 and the first fin central line C1 which is measured at the first height h22 may be greater than the distance L12 between the first sidewall S11 and the first fin central line C1 which is measured at the first height h22. Likewise, the distance L23 between the second sidewall S12 and the first fin central line C1 which is measured at the second height h23 may be greater than the distance L13 between the first sidewall S11 and the first fin central line C1 which is measured at the first height h22. However, inventive concepts are not limited thereto.

Additionally, the second sidewall S12 of the first fin pattern 110 may include a first inflection point P3, and the first sidewall S11 of the first fin pattern 110 may include a second inflection point P4. A distance from the first boundary line M1 to the first inflection point P3 may be h31, and a distance from the first boundary line M1 to the second inflection point P4 may be h21-h22.

The distance h31 between the first boundary line M1 and the first inflection point P3 of the second sidewall S12 may be different from the distance h21-h22 between the first boundary line M1 and the second inflection point P4 of the first sidewall S11.

In addition, the first inflection point P3 of the second sidewall S12 may be included in the upper part 112 of the first fin pattern 110, and the second inflection point P4 may be included in the lower part 111 of the first fin pattern 110. That is, the first inflection point P3 of the second sidewall S12 may be located higher than the upper surface of the field insulating layer 105, and the second inflection point P4 of the first sidewall S11 may be located in the field insulating layer 105. However, inventive concepts are not limited thereto.

Figure 5:
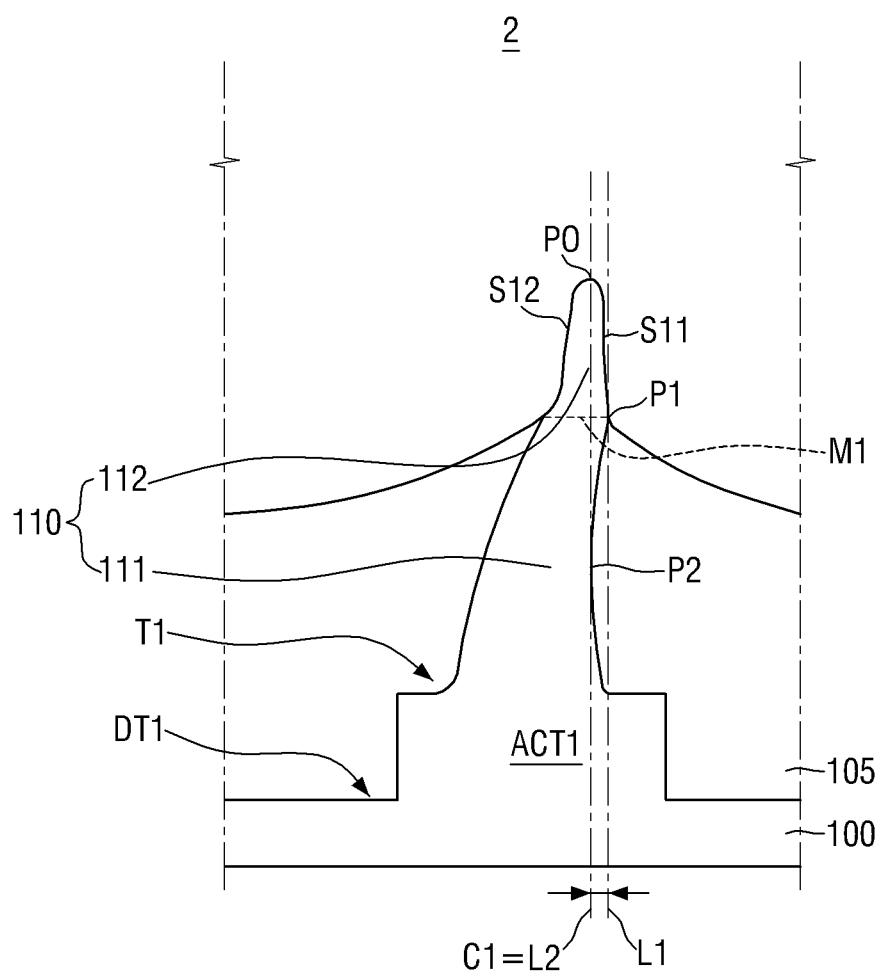
FIG. 5 illustrates a modified example of the semiconductor device of FIG. 1.

FIG. 5 illustrates a modified example 2 of the semiconductor device 1 of FIG. 1. For simplicity, a redundant description of elements identical to those previously described will be omitted and the description will focus mainly on the differences compared to previously-described elements.

Referring to FIG. 5, in the modified example 2 of the semiconductor device 1 of FIG. 1, the profile of an upper part 112 of a first fin pattern 110 may tilt further to the right than in the semiconductor device 1.

Specifically, a straight line parallel to a first fin central line C1 may meet a first point P1 and a second point P2 on a first sidewall S11. When the first fin central line C1 is moved parallel to the first fin pattern 110, points at which the first fin central line C1 meets the first sidewall S11 may be the first point P1 and the second point P2. The first point P1 may be located further outwards of the first fin pattern 110 than the second point P2. The second point P2 may be located under the first point P1 and closer to the first fin central line C1 than the first point P1. For example, the second point P2 may be disposed on the first fin central line C1.

A straight line that passes through the first point P1 and is parallel to the first fin central line C1 may be defined as a first line L1, and a straight line that passes through the second point P2 and is parallel to the first fin central line C1 may be defined as a second line L2. In this case, the second line L2 may overlap the first fin central line C1. However, inventive concepts are not limited thereto, and the second line L2 can be located closer to the first fin central line C1 than the first line L1.

Accordingly, part of a lower part of the first sidewall S11 of the first fin pattern 110 may contact the first fin central line C1. However, inventive concepts are not limited thereto. For example, the profile of the upper part 112 of the first fin pattern 110 can tilt to the left instead of to the right.

Figure 6:
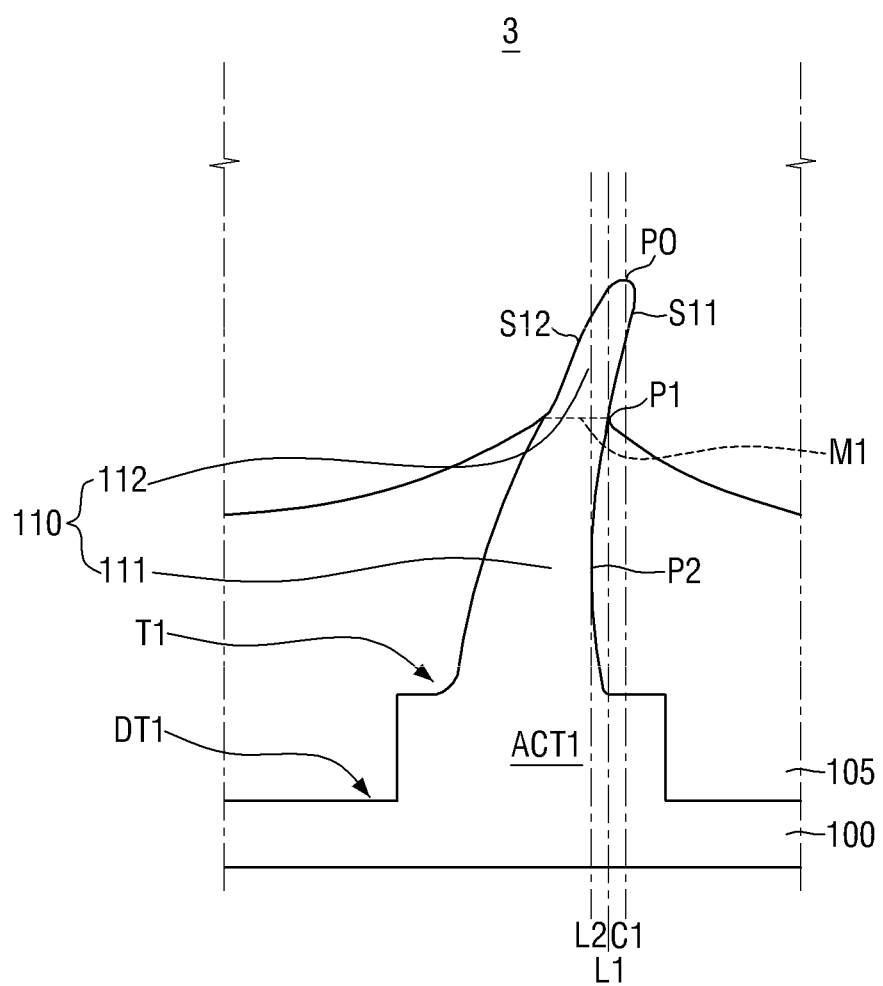
FIG. 6 illustrates another modified example of the semiconductor device of FIG. 1.

FIG. 6 illustrates another modified example 3 of the semiconductor device 1 of FIG. 1. For simplicity, a redundant description of elements identical to those previously described will be omitted and the description will focus mainly on the differences compared to previously-described elements.

Referring to FIG. 6, in the modified example 3 of the semiconductor device 1 of FIG. 1, the profile of an upper part 112 of a first fin pattern 110 may tilt further to the right than in the semiconductor device 1 described above.

Specifically, a first line L1 may be located closer to a first fin central line C1 than a second line L2.

Here, the first fin central line C1 is a straight line that is orthogonal to a first boundary line M1 and meets a highest part P0 of the first fin pattern 110. The first fin central line C1 may not substantially be the center of gravity of the first fin pattern 110. The first fin central line C1 may be located further outwards of the first fin pattern 110 than the first line L1 and the second line L2.

In addition, a first sidewall S11 of the first fin pattern 110 may be shorter than a second sidewall S12. Here, a point at which the first sidewall S11 and the second sidewall S12 meet each other may be the highest part P0 of the first fin pattern 110. For example, a sidewall located to the right of the highest part P0 may be the first sidewall S11, and a sidewall located to the left of the highest part P0 may be the second sidewall S12.

However, inventive concepts are not limited thereto. For example, the upper part 112 of the first fin pattern 110 may tilt to the left instead of to the right.

Figure 7A:
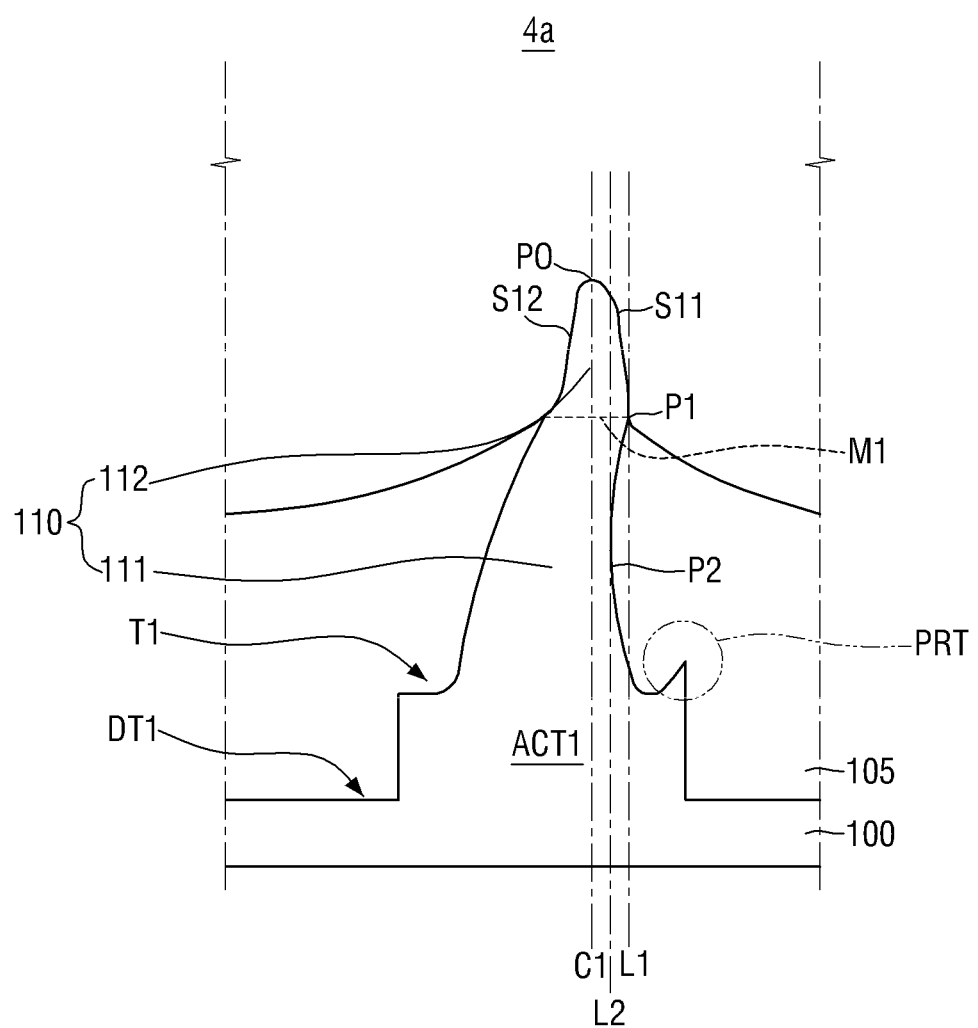
FIGS. 7a through 7c illustrate other modified examples of the semiconductor device of FIG. 1.
Figure 7B:
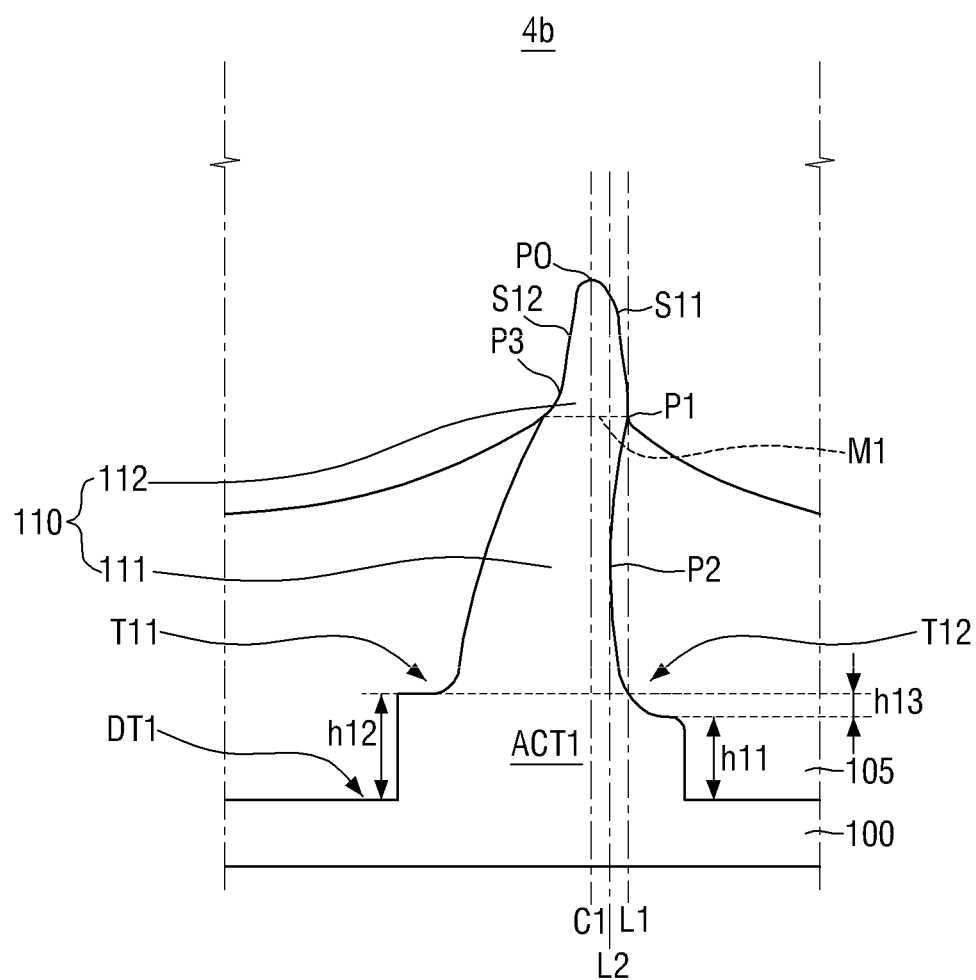
Figure 7C:
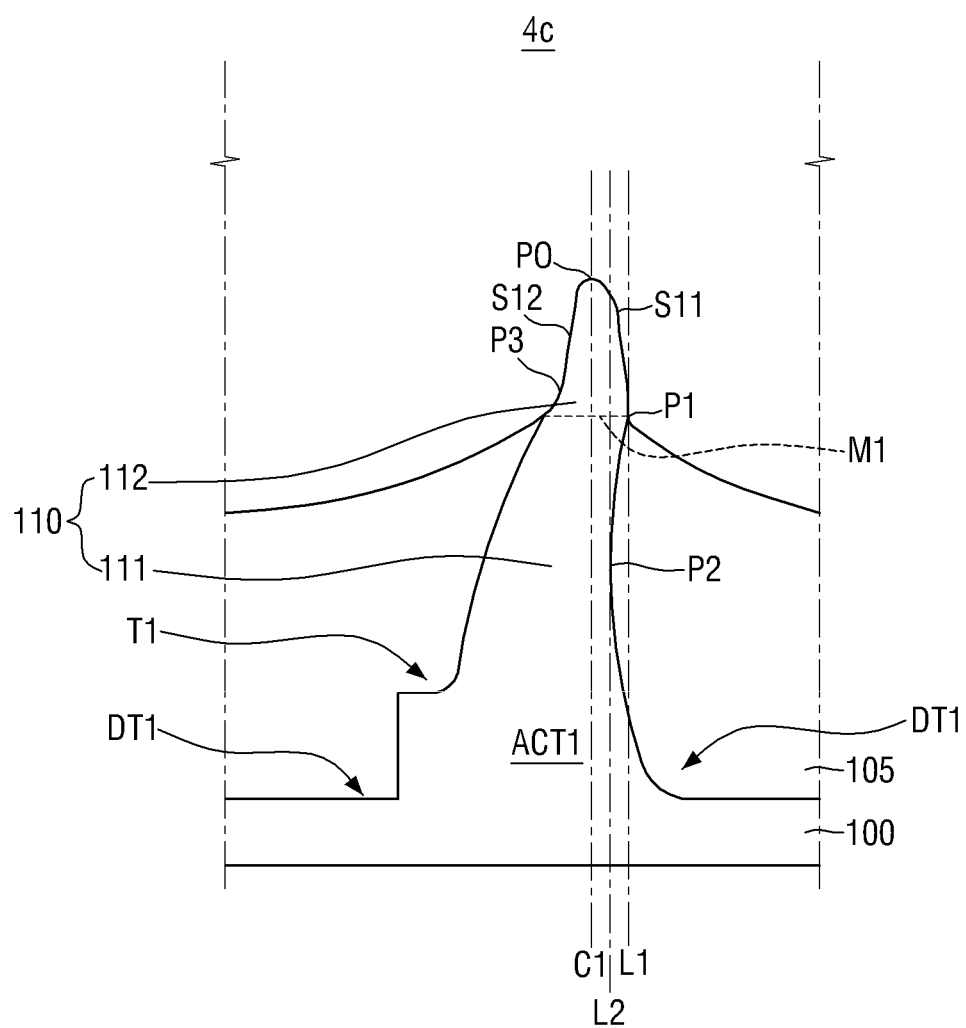

FIGS. 7a through 7c illustrate other modified examples 4a through 4c of the semiconductor device 1 of FIG. 1. For simplicity, a redundant description of elements identical to those previously described will be omitted and the description will focus mainly on the differences compared to previously-described elements.

Referring to FIG. 7a, the modified example 4a of the semiconductor device 1 of FIG. 1 may further include a protrusion structure PRT.

The protrusion structure PRT may protrude from the bottom of a first shallow trench T1 and may be formed lower than an upper surface of a field insulating layer 105. The protrusion structure PRT may be located at a boundary between the first shallow trench T1 and a first deep trench DT1.

In FIG. 7a, the protrusion structure PRT is formed on a side of a first fin pattern 110. However, inventive concepts are not limited thereto. That is, the protrusion structure PRT can also be formed on both sides of the first fin pattern 110. The protrusion structure PRT may be formed in all semiconductor devices (e.g., between a shallow trench and a deep trench) according to example embodiments of inventive concepts which will be described below, but inventive concepts are not limited thereto.

Referring to FIG. 7b, in the modified example 4b of the semiconductor device 1 of FIG. 1, a first fin pattern 110 is defined by a first shallow trench T1. Here, the first shallow trench T1 may include a first sub-trench T12 which contacts a first sidewall S11 and a second sub-trench T11 which contacts a second sidewall S12.

An upper surface of the first sub-trench T12 may lie in a different plane from an upper surface of the second sub-trench T11. That is, a height h11 of the first sub-trench T12 from an upper surface of a substrate may be different from a height h12 of the second sub-trench T11 from the upper surface of the substrate. For example, the height h11 of the first sub-trench T12 may be lower than the height h12 of the second sub-trench T11. The height h11 of the first sub-trench T12 may be different from the height h12 of the second sub-trench T11 by h13. Here, the upper surface of the first sub-trench T12 may be located higher than the upper surface of the first deep trench DT1, but inventive concepts are not limited thereto.

Referring to FIG. 7c, in the modified example 4c of the semiconductor device 1 of FIG. 1, a first fin pattern 110 is defined by a first shallow trench T1 and a first deep trench DT1.

Here, a first sidewall S11 of the first fin pattern 110 may contact the first deep trench DT1, and a second sidewall S12 may contact the first shallow trench T1. That is, a lowest end of the first sidewall S11 and a lowest end of the second sidewall S12 may be at different heights, but inventive concepts are not limited thereto.

Figure 8A:
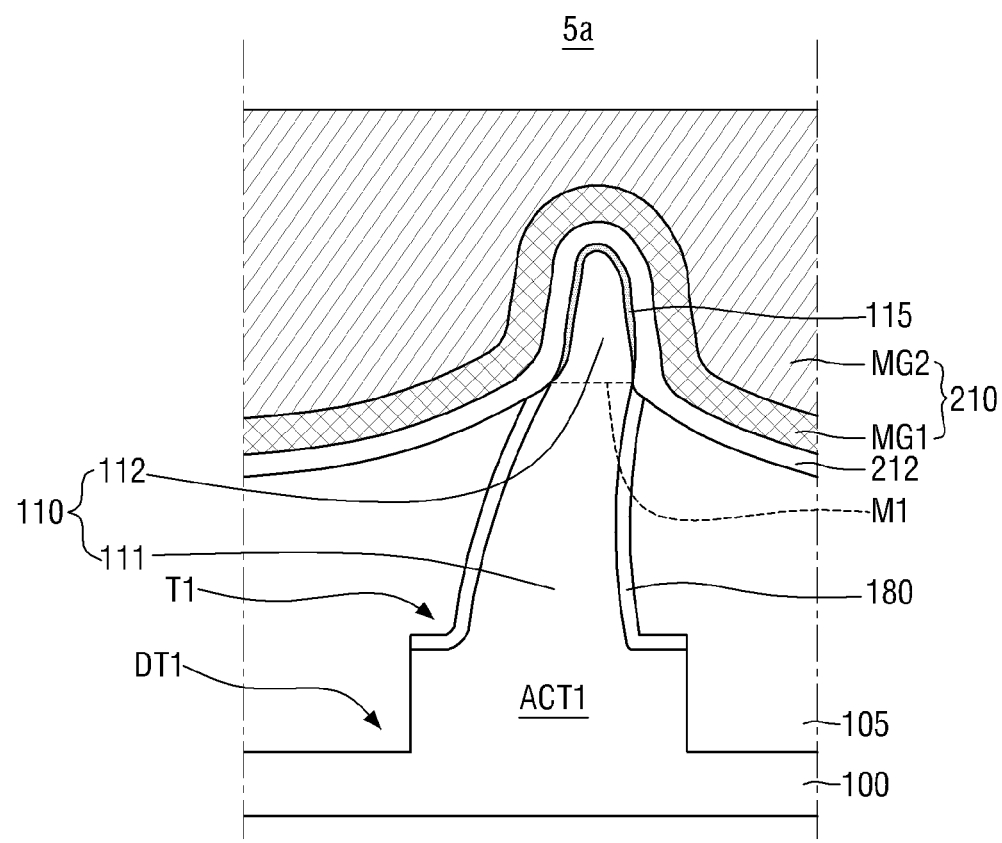
FIGS. 8a and 8b are cross-sectional views of semiconductor devices according to example embodiments of inventive concepts.
Figure 8B:
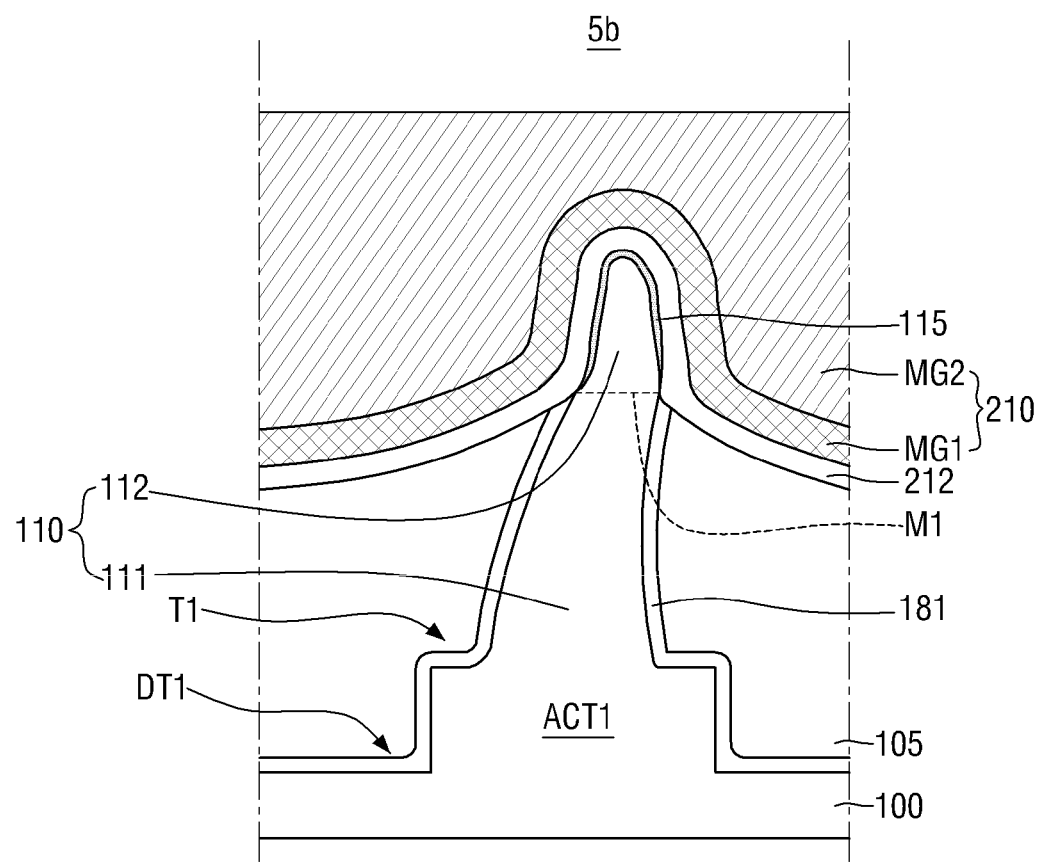

FIGS. 8a and 8b are cross-sectional views of semiconductor devices 5a and 5b according to example embodiments of inventive concepts. For simplicity, a redundant description of elements identical to those previously described will be omitted and the description will focus mainly on the differences compared to previously-described elements.

Referring to FIGS. 8a and 8b, the semiconductor devices 5a and 5b according to example embodiments may further include liners 180 and 181, respectively.

Specifically, referring to FIG. 8a, the liner 180 may be formed on side surfaces of a lower part 111 of a first fin pattern 110 and a first shallow trench T1. The liner 180 may be conformally formed on an upper surface of a first active region ACT1 and side surfaces of the first fin pattern 110. The liner 180 may contain polycrystalline silicon (poly-Si), silicon nitride (SiN), silicon oxynitride (SiON), or silicon oxide ($SiO_2$). The liner 180 may be formed by a chemical oxidation process or an etch-back process. For example, the liner 180 may be formed by, but not limited to, an atomic layer deposition (ALD) process or an in-situ steam generation (ISSG) process.

Although not specifically illustrated in the drawing, the liner 180 may include a plurality of layers. Here, the liner 180 may include a first layer and a second layer which contain different materials. For example, the first layer may contain, but not limited to, poly-Si, and the second layer may contain, but not limited to, SiN.

Referring to FIG. 8b, the liner 181 may be the same as the liner 180 in FIG. 8a, except the liner 181 may be formed on side surfaces of a lower part 111 of a first fin pattern 110, a first shallow trench T1, and a first deep trench DT1. Here, the liner 181 may be conformally formed to a uniform thickness. The liner 181 formed on the side surfaces of the lower part 111 of the first fin pattern 110, the first shallow trench T1 and the first deep trench DT1 may be a single piece containing the same material. In addition, although not specifically illustrated in the drawing, the liner 181 may include, but not limited to, a plurality of layers.

Figure 9:
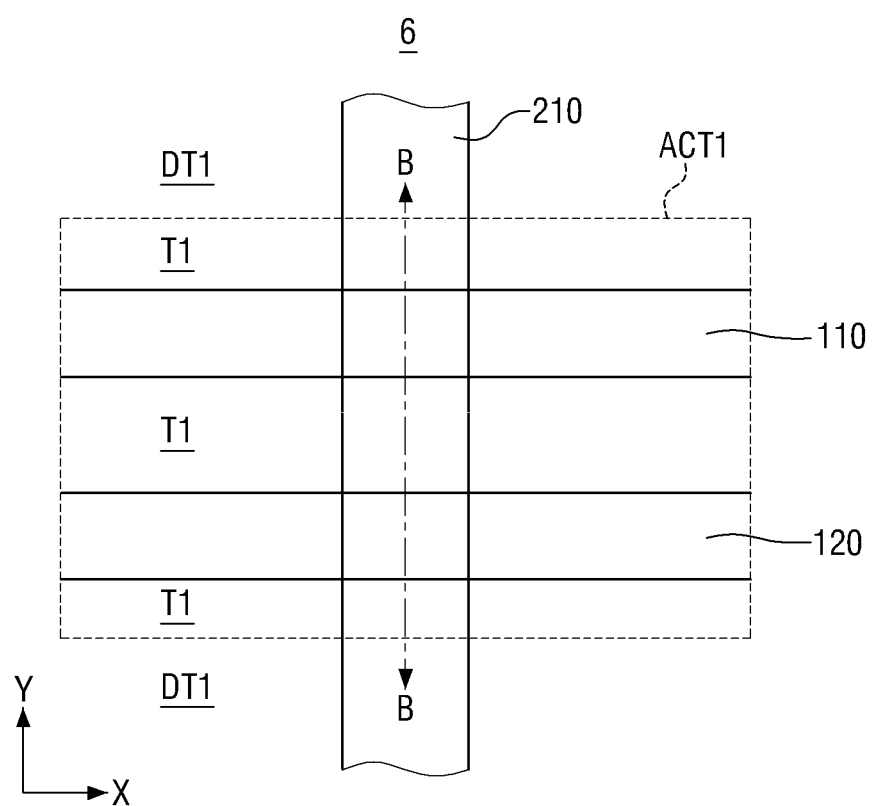
FIG. 9 is a layout view of a semiconductor device according to example embodiments of inventive concepts.
Figure 10:
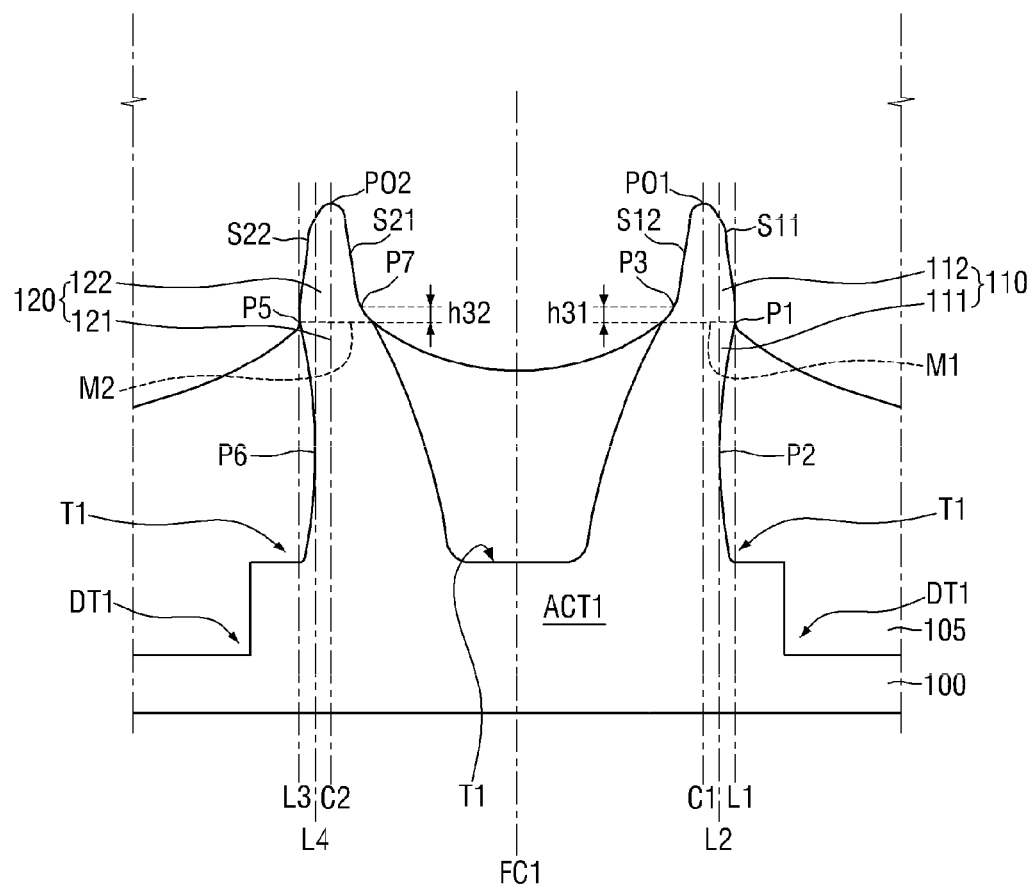
FIG. 10 is a cross-sectional view taken along the line B-B of FIG. 9.

FIG. 9 is a layout view of a semiconductor device 6 according to example embodiments of inventive concepts. FIG. 10 is a cross-sectional view taken along the line B-B of FIG. 9. For simplicity, a redundant description of elements identical to those previously described will be omitted and the description will focus mainly on the differences compared to previously-described elements. In addition, FIG. 10 illustrates first and second fin patterns 110 and 120 and a field insulating layer 105 only, excluding a gate electrode 210.

Referring to FIGS. 9 and 10, the semiconductor device 6 according to example embodiments may further include the second fin pattern 120. The second fin pattern 120 may be formed most adjacent to the first fin pattern 110.

The second fin pattern 120 may be formed in a first active region ACT1 of a substrate 100. The second fin pattern 120 may extend along a first direction X. The field insulating layer 105 may contact part of the second fin pattern 120.

The second fin pattern 120 may be defined by a first shallow trench T1 of a first depth. The first shallow trench T1 may be disposed between the first fin pattern 110 and the second fin pattern 120 to divide the first fin pattern 110 and the second fin pattern 120. The first shallow trench T1 may be disposed on both sides of the second fin pattern 120.

The second fin pattern 120 may include a third sidewall S21 and a fourth sidewall S22 which face each other. The second fin pattern 120 may include an upper part 122 and a lower part 121. In addition, the second fin pattern 120 may include a second boundary line M2 between the upper part 122 of the second fin pattern 120 and the lower part 121 of the second fin pattern 120. The lower parts 111 and 121 of the first fin pattern 110 and second fin pattern 120 may include concave sidewalls along the sidewalls S11 and S22 and tilted (and/or convex) sidewalls along the sidewalls S12 and S22.

The first shallow trench T1 that divides the first fin pattern 110 and the second fin pattern 120 may be disposed between a second sidewall S12 of the first fin pattern 110 and the third sidewall S21 of the second fin pattern 120. The first deep trench DT1 that defines the first active region ACT1 may be formed adjacent to each of a first sidewall S11 of the first fin pattern 110 and the fourth sidewall S22 of the second fin pattern 120. Here, the depth of the first shallow trench T1 may be, but is not limited to, smaller than or equal to that of the first deep trench DT1.

In addition, although not specifically illustrated in the drawings, a protrusion PRT (see FIG. 7a) may be located at a boundary between the first shallow trench T1 and the first deep trench DT1. Here, the protrusion structure PRT (see FIG. 7a) may be formed on one side of the first fin pattern 110 or the other side of the second fin pattern 120, but inventive concepts are not limited thereto.

The field insulating layer 105 may contact part of the second fin pattern 120. The lower part 121 of the second fin pattern 120 may be surrounded by the field insulating layer 105, and the upper part 122 of the second fin pattern 120 may be surrounded by the gate electrode 210.

In addition, the second fin pattern 120 may include a second fin central line C2 which is orthogonal to the second boundary line M2 and meets a highest part P02 of the second fin pattern 120. That is, the second fin central line C2 may meet the highest part P02 of the upper part 122 of the second fin pattern 120.

In the semiconductor device 6 according to example embodiments, the first sidewall S11 and the second sidewall S12 of the first fin pattern 110 may be asymmetrical to each other with respect to a first fin central line C1, and the third sidewall S21 and the fourth sidewall S22 of the second fin pattern 120 may be asymmetrical to each other with respect to the second fin central line C2. For example, the first fin pattern 110 may be bent to one side, and the second fin pattern 120 may be bent to the other side.

More specifically, the second fin pattern 120 may include a third point P5 and a fourth point P6 on the fourth sidewall S22 which meet a straight line parallel to the second fin central line C2. Specifically, when the second fin central line C2 is moved outwards of the second fin pattern 120 in parallel, points at which the second fin central line C2 meets the fourth sidewall S22 may be the third point P5 and the fourth point P6.

The third point P5 may be located further outwards of the second fin pattern 120 than the fourth point P6. In addition, the fourth point P6 may be located under the third point P5 and closer to the second fin central line C2 than the third point P5.

Here, a third line L3 may pass through the third point P5 and may be parallel to the second fin central line C2. Likewise, a fourth line L4 may pass through the fourth point P6 and may be parallel to the second fin central line C2. Therefore, the third line L3 and the fourth line L4 may be perpendicular to the second boundary line M2.

The fourth line L4 may be located closer to the second fin central line C2 than the third line L3. Accordingly, a lower part of the fourth sidewall S22 of the second fin pattern 120 may be located closer to the second fin central line C2 than the third point P5, but inventive concepts are not limited thereto.

In addition, a third distance between the fourth sidewall S22 and the second fin central line C2 which is measured at a first height from a lower surface of the first shallow trench T1 may be greater than a fourth distance between the fourth sidewall S22 and the second fin central line C2 which is measured at a second height from the lower surface of the first shallow trench T1.

Additionally, a first field central line FC1 may be defined between the first fin central line C1 and the second fin central line C2 and at a location separated from the first fin central line C1 and the second fin central line C2 by equal distances.

In the semiconductor device 6 according to example embodiments, the first fin pattern 110 and the second fin pattern 120 may be symmetrical to each other with respect to the first field central line FC1. The second sidewall S12 of the first fin pattern 110 and the third sidewall S21 of the second fin pattern 120 may be symmetrical to each other with respect to the first field central line FC1. In addition, the first sidewall S11 of the first fin pattern 110 and the fourth sidewall S22 of the second fin pattern 120 may be symmetrical to each other with respect to the first field central line FC1.

In addition, at the same height, a slope of the third sidewall S21 may be substantially equal to that of the second sidewall S12, and a slope of the fourth sidewall S22 may be substantially equal to that of the first sidewall S11. A distance between a first line L1 and a second line L2 may be substantially equal to a distance between the third line L3 and the fourth line L4.

In addition, the second sidewall S12 of the first fin pattern 110 may include a first inflection point P3, and the third sidewall S21 of the second fin pattern 120 may include a third inflection point P7. The first inflection point P1 may be separated from the first boundary line M1 by a first gap h31, and the third inflection point P7 may be separated from the second boundary line M2 by a second gap h32. Here, the first gap h31 may be substantially equal to the second gap h32, and both the first inflection point P3 and the third inflection point P7 may not contact the field insulating layer 105. However, inventive concepts are not limited thereto.

Figure 11:
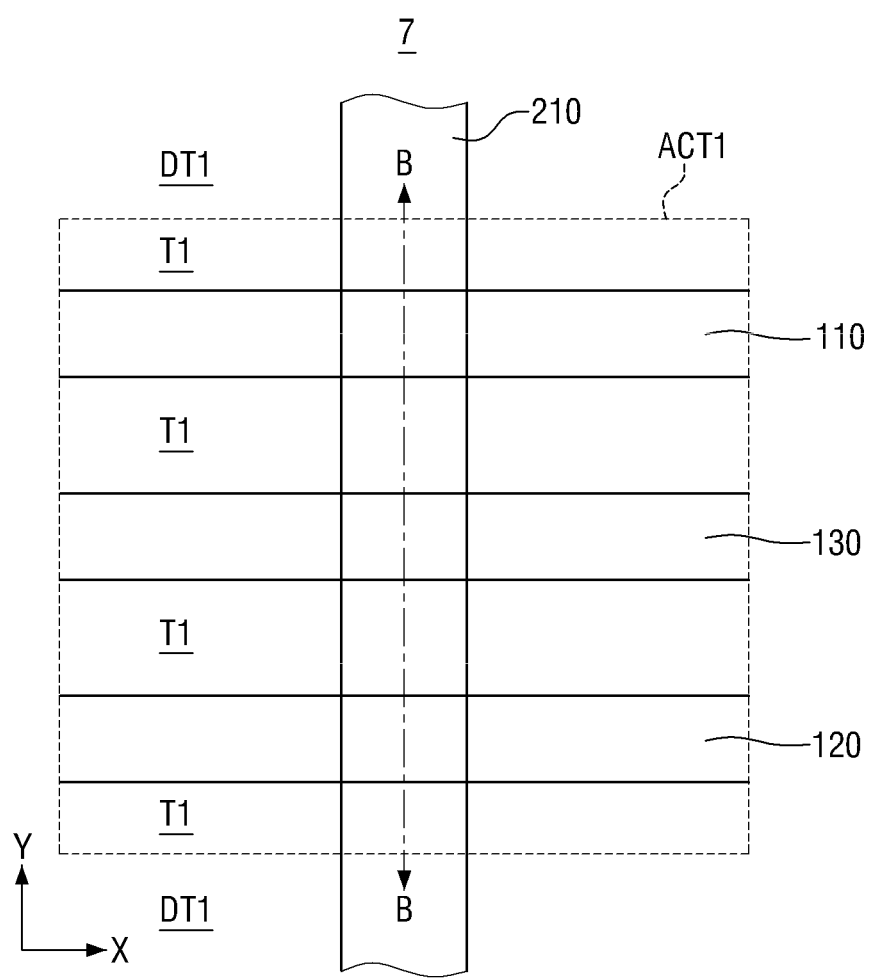
FIG. 11 is a layout view of a semiconductor device according to example embodiments of inventive concepts.
Figure 12:
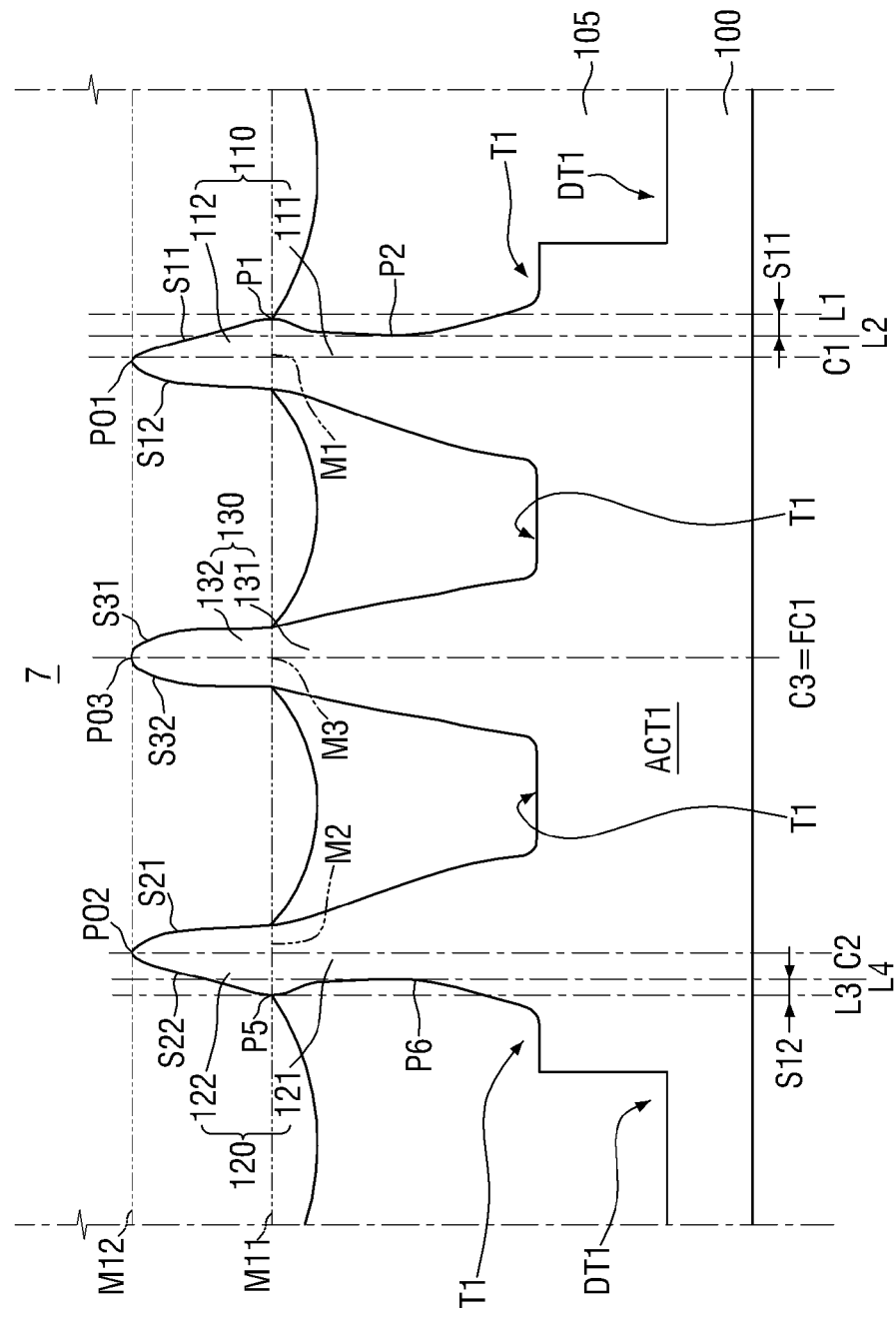
FIG. 12 is a cross-sectional view taken along the line B-B of FIG. 11.

FIG. 11 is a layout view of a semiconductor device 7 according to example embodiments of inventive concepts. FIG. 12 is a cross-sectional view taken along the line B-B of FIG. 11. In addition, FIG. 12 illustrates first through third fin patterns 110 through 130 and a field insulating layer 105 only, excluding a gate electrode 210. For simplicity, a redundant description of elements identical to those previously described will be omitted and the description will focus mainly on the differences compared to previously-described elements.

Referring to FIGS. 11 and 12, the semiconductor device 7 according to example embodiments may further include the third fin pattern 130. The third fin pattern 130 may be disposed between the first fin pattern 110 and the second fin pattern 120. The third fin pattern 130 may be symmetrical with respect to a third fin central line C3.

In addition, a field central line FC1 located between a first fin central line C1 and a second fin central line C2 and separated from the first fin central line C1 and the second fin central line C2 by equal distances may be disposed in the third fin pattern 130. In FIG. 12, the third fin central line C3 is the same as the first field central line FC1, but inventive concepts are not limited thereto.

The third fin pattern 130 may be formed in a first active region ACT1 of a substrate 100. The third fin pattern 130 may extend along a first direction X. The field insulating layer 105 may contact part of the third fin pattern 130.

The third fin pattern 130 may be defined by a first shallow trench T1 of a first depth. The first shallow trench T1 may be disposed between the second fin pattern 120 and the third fin pattern 130 and between the first fin pattern 110 and the third fin pattern 130 to divide the second fin pattern 120 and the third fin pattern 130. The first shallow trench T1 may be disposed on both sides of the third fin pattern 130.

The third fin pattern 130 may include a fifth sidewall S31 and a sixth sidewall S32 which face each other. The third fin pattern 130 may include an upper part 132 and a lower part 131. In addition, the third fin pattern 130 may include a third boundary line M3 between the upper part 132 of the third fin pattern 130 and the lower part 131 of the third fin pattern 130.

The lower part 131 of the third fin pattern 130 may contact the field insulating layer 105, and the upper part 132 of the third fin pattern 130 may not contact the field insulating layer 105.

In addition, the third fin pattern 130 may include the third fin central line C3 which is orthogonal to the third boundary line M3 and meets a highest part P03 of the third fin pattern 130. That is, the third fin central line C3 may meet the highest part P03 of the upper part 132 of the third fin pattern 130. Here, the fifth sidewall and the sixth sidewall of the third fin pattern 130 may be symmetrical to each other with respect to the third fin central line C3.

In the semiconductor device 7, the first fin pattern 110 and the second fin pattern 120 may be symmetrical to each other with respect to the first field central line FC1. In addition, the third fin pattern 130 may be symmetrical with respect to the first field central line FC1. However, inventive concepts are not limited thereto. The sidewalls S11 and S22 of the lower parts 111 and 121 of the first fin pattern 110 and second fin pattern 120 may be concave. The sidewalls of the lower parts 111 and 121 of the first fin pattern 110 and second fin pattern 120 that face the third fin pattern 130 may be concave. The sidewalls of the lower part 131 of the third fin pattern 130 may be tilted (and/or convex).

Figure 13:
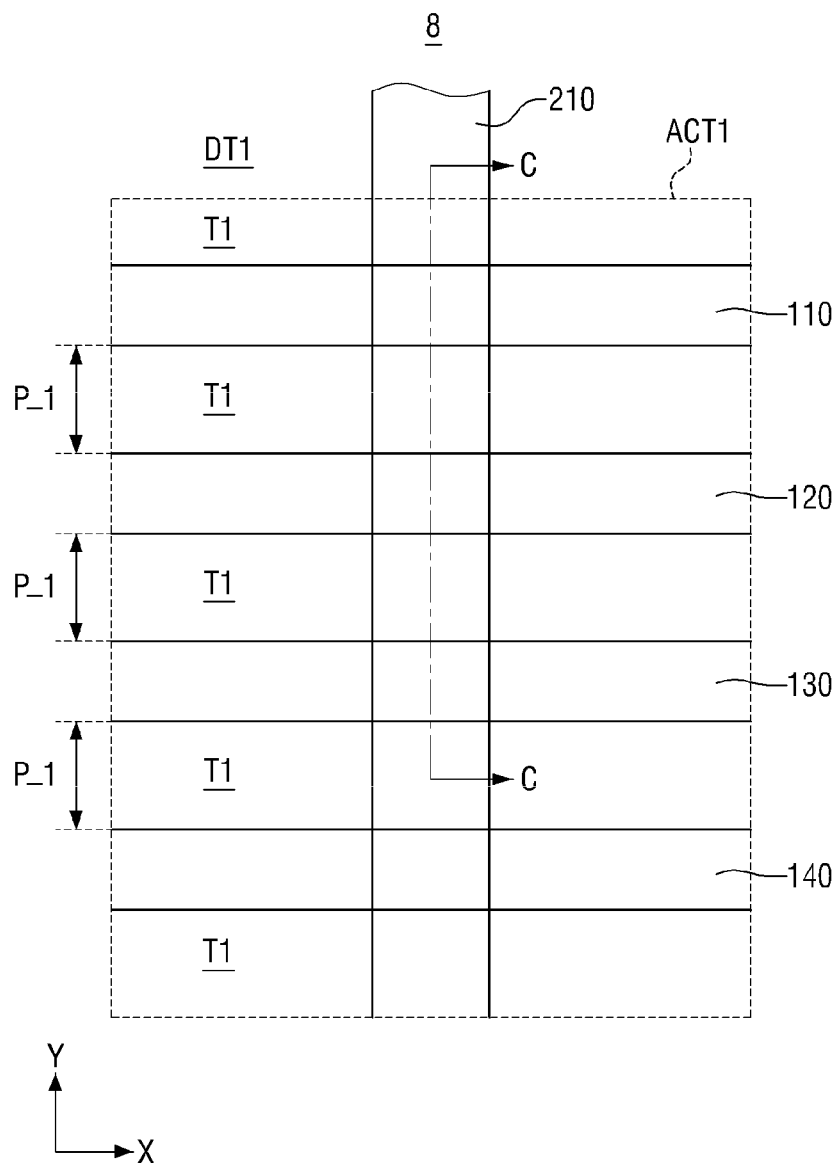
FIG. 13 is a layout view of a semiconductor device according to example embodiments of inventive concepts.
Figure 14:
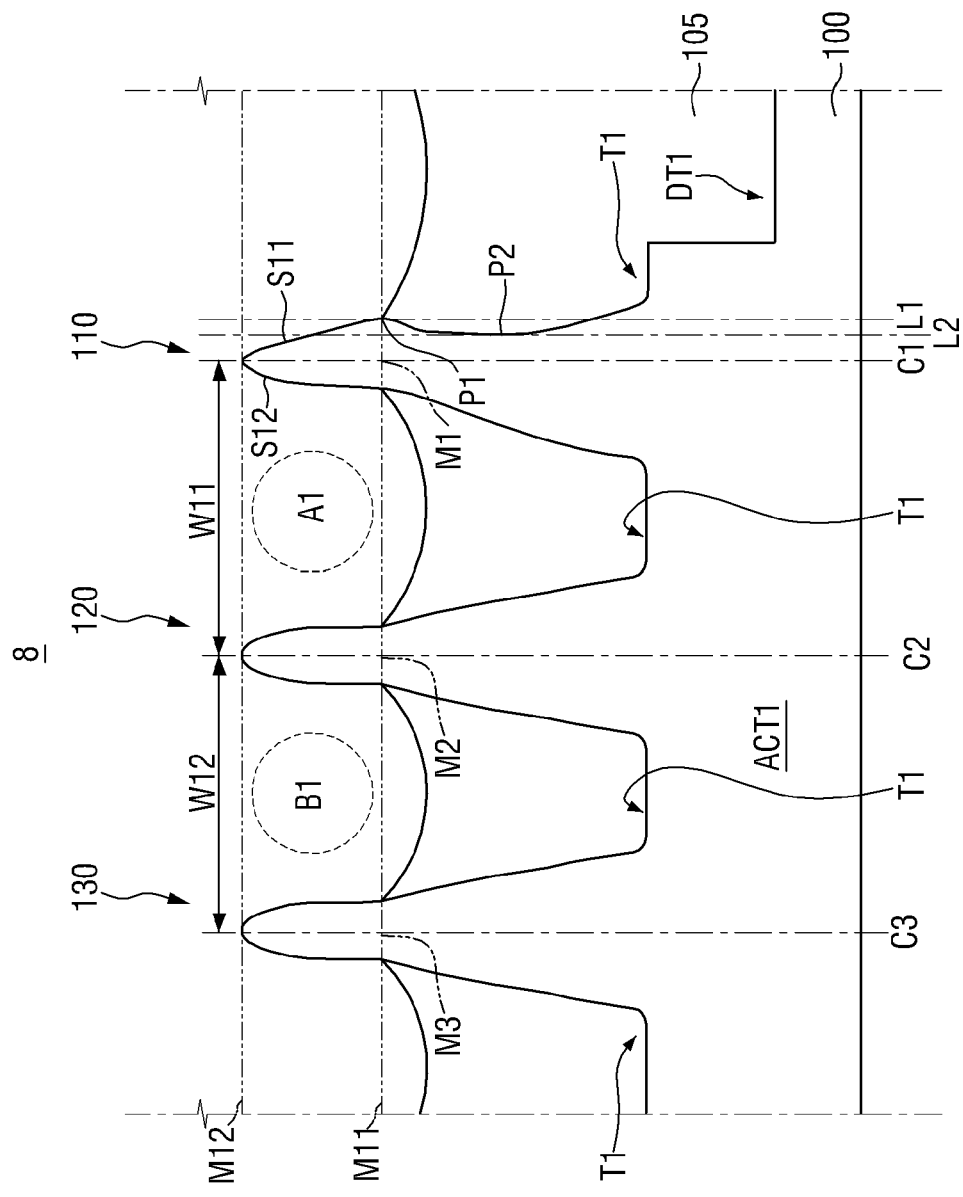
FIG. 14 is a cross-sectional view taken along the line C-C of FIG. 13.

FIG. 13 is a layout view of a semiconductor device 8 according to example embodiments of inventive concepts. FIG. 14 is a cross-sectional view taken along the line C-C of FIG. 13. For simplicity, a redundant description of elements identical to those previously described will be omitted and the description will focus mainly on the differences compared to previously-described elements.

Referring to FIGS. 13 and 14, the semiconductor device 8 according to example embodiments may include first through fourth fin patterns 110 through 140. The first through fourth fin patterns 110 through 140 may be formed in a first active region ACT1 of a substrate 100. The first through fourth fin patterns 110 through 140 may extend along a first direction X. The first through fourth fin patterns 140 may be parallel to each other. The first through fourth fin patterns 110 through 140 may be defined by a first shallow trench T1.

The first through fourth fin patterns 110 through 140 may be arranged at equal pitches (P_1). That is, the first through fourth fin patterns 110 through 140 may be arranged at regular intervals of a first pitch P_1.

Here, the first fin pattern 110 may have an asymmetrical profile as described above with reference to FIGS. 1 through 7c. Since the asymmetrical profile of the first fin pattern 110 has been described above in detail, a description thereof will be omitted. On the other hand, each of the second through fourth fin patterns 120 through 140 may have a symmetrical profile.

Specifically, referring to FIG. 14, the first fin pattern 110 may be bent to one side. For example, a first sidewall S11 of the first fin pattern 110 may be bent in an 'S' shape.

The first fin pattern 110 includes a lower part which is surrounded by a field insulating layer 105, an upper part which is surrounded by a gate electrode 210, a first boundary line M1 which divides the upper part and the lower part of the first fin pattern 110, and a first fin central line C1 which is orthogonal to the first boundary line M1 and meets a highest part of the upper part of the first fin pattern 110.

Here, the first fin pattern 110 may include a first point P1 and a second point P2 on the first sidewall S11 which meet a straight line parallel to the first fin central line C1. The second point P2 may be located under the first point P1 and closer to the first fin central line C1 than the first point P1. A first line L1 and a second line L2 parallel to the first fin central line C1 can be drawn.

The first line L1 may pass through the first point P1 and may be parallel to the first fin central line C1. Likewise, the second line L2 may pass through the second point P2 and may be parallel to the first fin central line C1. The second line L2 may be located closer to the first fin central line C1 than the first line L1. Accordingly, a lower part of the first sidewall S11 of the first fin pattern 110 may be located closer to the first fin central line C1 than the first point P1. However, inventive concepts are not limited thereto.

The second fin pattern 120 and the third fin pattern 130 may be defined by the first shallow trench T1 of a first depth. The first shallow trench T1 may be located between the first fin pattern 110 and the second fin pattern 120 and between the second fin pattern 120 and the third fin pattern 130. In addition, the first shallow trench T1 located between the first fin pattern 110 and the second fin pattern 120 may have the same width as the first shallow trench T1 between the second fin pattern 120 and the third fin pattern 130.

The second fin pattern 120 may include an upper part and a lower part. In addition, the second fin pattern 120 may include a second boundary line M2 between the upper part of the second fin pattern 120 and the lower part of the second fin pattern 120. The lower part of the second fin pattern 120 may be surrounded by the field insulating layer 105, and the upper part of the second fin pattern 120 may be surrounded by the gate electrode 210.

In addition, the second fin pattern 120 may include a second fin central line C2 which is orthogonal to the second boundary line M2 and meets a highest part of the second fin pattern 120. That is, the second fin central line C2 may meet the highest part of the upper part of the second fin pattern 120.

Likewise, the third fin pattern 130 may include an upper part and a lower part. In addition, the third fin pattern 130 may include a third boundary line M3 between the upper part of the third fin pattern 130 and the lower part of the third fin pattern 130. The lower part of the third fin pattern 130 may be surrounded by the field insulating layer 105, and the upper part of the third fin pattern 130 may be surrounded by the gate electrode 210.

In addition, the third fin pattern 130 may include a third fin central line C3 which is orthogonal to the third boundary line M3 and meets a highest part of the third fin pattern 130. That is, the third fin central line C3 may meet the highest part of the upper part of the third fin pattern 130.

The first boundary line M1, the second boundary line M2 and the third boundary line M3 may be located on the same line M11. Likewise, the highest part of the first fin pattern 110, the highest part of the second fin pattern 120, and the highest part of the third fin pattern 130 may be located on the same line M12.

Here, a first gap W11 between the second fin central line C2 and the first fin central line C1 may be different from a second gap W12 between the third fin central line C3 and the second fin central line C2. For example, the first gap W11 may be greater than the second gap W12. This is because the first sidewall S11 of the first fin pattern 110 has a profile bent outwards of the first active region ACT1. However, inventive concepts are not limited thereto.

Additionally, a first area A1 between the upper part of the first fin pattern 110 and the upper part of the second fin pattern 120 may be different from a second area B1 between the upper part of the second fin pattern 120 and the upper part of the third fin pattern 130. For example, the first area A1 may be, but is not limited to, larger than the second area B1.

Figure 15:
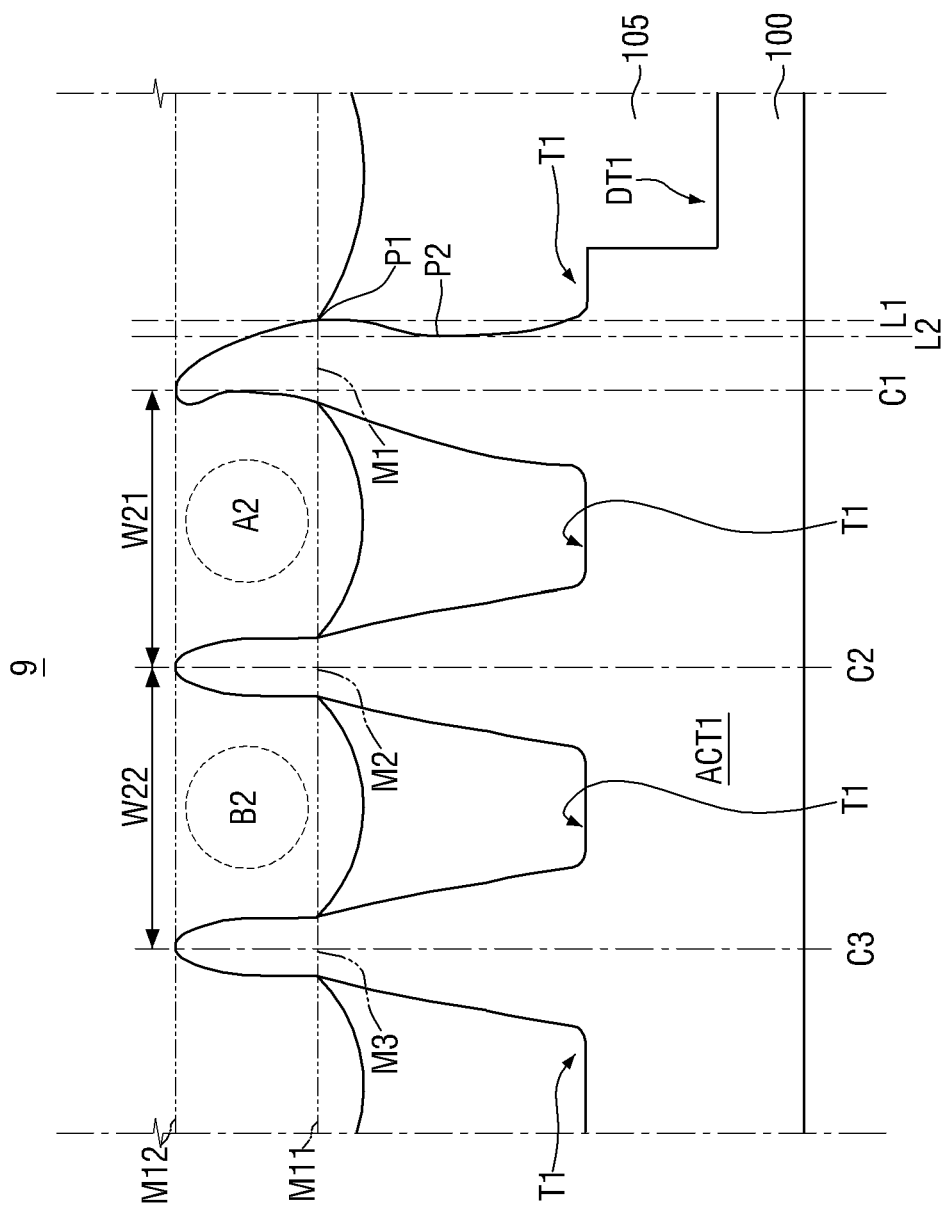
FIG. 15 illustrates a modified example of the semiconductor device of FIGS. 13 and 14.

FIG. 15 illustrates a modified example 9 of the semiconductor device 8 of FIGS. 13 and 14. For simplicity, a redundant description of elements identical to those previously described will be omitted and the description will focus mainly on the differences compared to previously-described elements.

Referring to FIG. 15, in the modified example 9 of the semiconductor device 8 of FIGS. 13 and 14, a first gap W21 between a second fin central line C2 and a first fin central line C1 may be equal to or smaller than a second gap W22 between a third fin central line C3 and the second fin central line C2. For example, the first gap W21 may be equal to the second gap W22. This is because an upper part of a first fin pattern 110 has a profile bent inwards of a first active region ACT1. However, inventive concepts are not limited thereto.

Additionally, a first area A2 between the upper part of the first fin pattern 110 and an upper part of a second fin pattern 120 may be, but is not limited to, substantially equal to or smaller than a second area B2 between the upper part of the second fin pattern 120 and an upper part of a third fin pattern 130.

Figure 16:
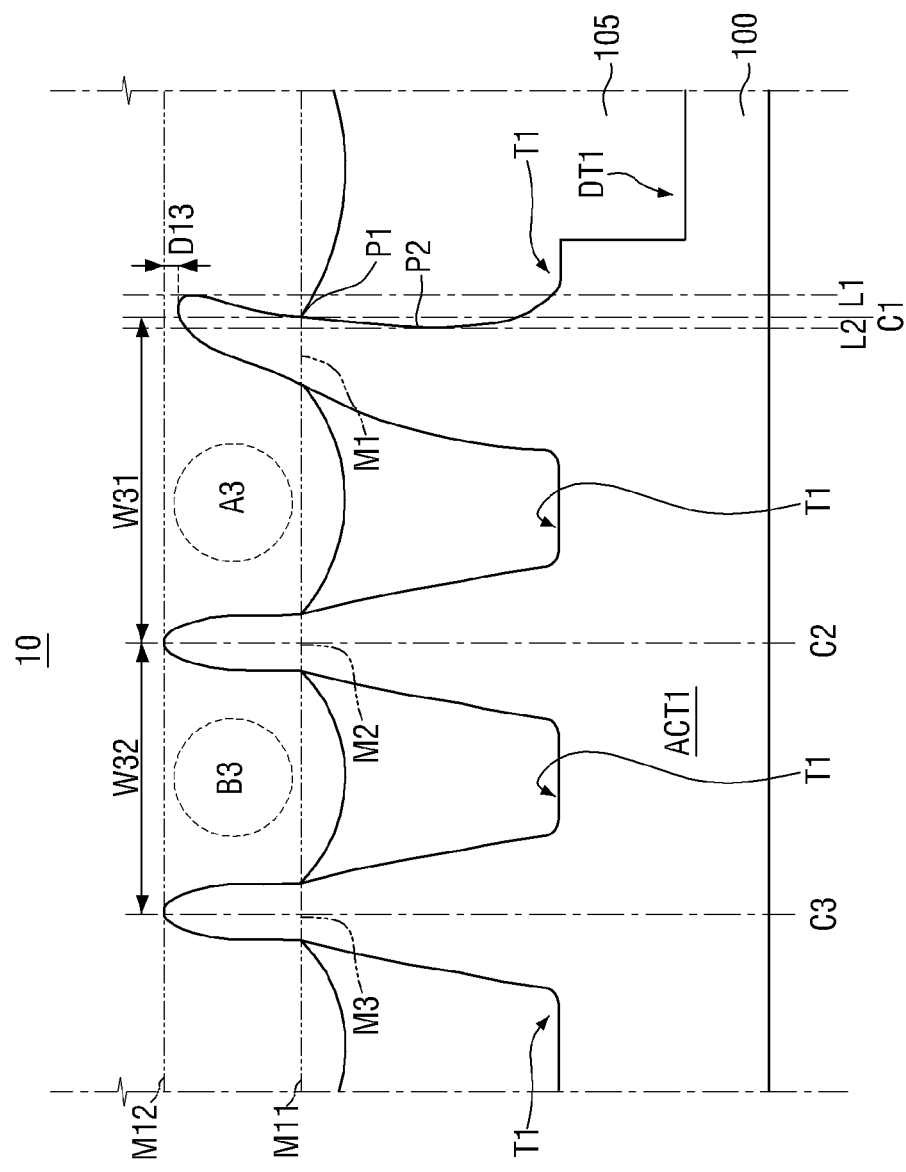
FIG. 16 illustrates another modified example of the semiconductor device of FIGS. 13 and 14.

FIG. 16 illustrates another modified example 10 of the semiconductor device 8 of FIGS. 13 and 14. For simplicity, a redundant description of elements identical to those previously described will be omitted and the description will focus mainly on the differences compared to previously-described elements.

Referring to FIG. 16, in the modified example 10 of the semiconductor device 8 of FIGS. 13 and 14, the profile of a first fin pattern 110 may be bent further outwards of a first active region ACT1 than that of the first fin pattern 110 described above with reference to FIG. 14.

Accordingly, a first fin central line C1 of the first fin pattern 110 may be disposed further outwards of the first fin pattern 110 than a second line L2. For example, the first fin central line C1 of the first fin pattern 110 may be located between a first line L1 and the second line L2. In addition, although not specifically illustrated in the drawing, the first fin central line C1 may be disposed further outwards of the first fin pattern 110 than the first line L1. However, inventive concepts are not limited thereto.

Accordingly, a first gap W31 between a second fin central line C2 and the first fin central line C1 may be different from a second gap W32 between a third fin central line C3 and the second fin central line C2. For example, the first gap W31 may be greater than the second gap W32. This is because a first sidewall S1 of the first fin pattern 110 has a profile bent further outwards of the first active region ACT1. However, inventive concepts are not limited thereto.

Additionally, a first area A3 between an upper part of the first fin pattern 110 and an upper part of a second fin pattern 120 may be different from a second area B3 between the upper part of the second fin pattern 120 and an upper part of a third fin pattern 130. For example, the first area A1 may be greater than the second area B3. However, inventive concepts are not limited thereto.

In addition, a height of the first fin pattern 110 may be different from that of the second fin pattern 120 or the third fin pattern 130. Accordingly, a highest part of the first fin pattern 110 may not lie on the same line M12 with a highest part of the second fin pattern 120 or a highest part of the third fin pattern 130. For example, the height of the first fin pattern 110 and the height of the second fin pattern 120 may be different by D13, but inventive concepts are not limited thereto.

Figure 17:
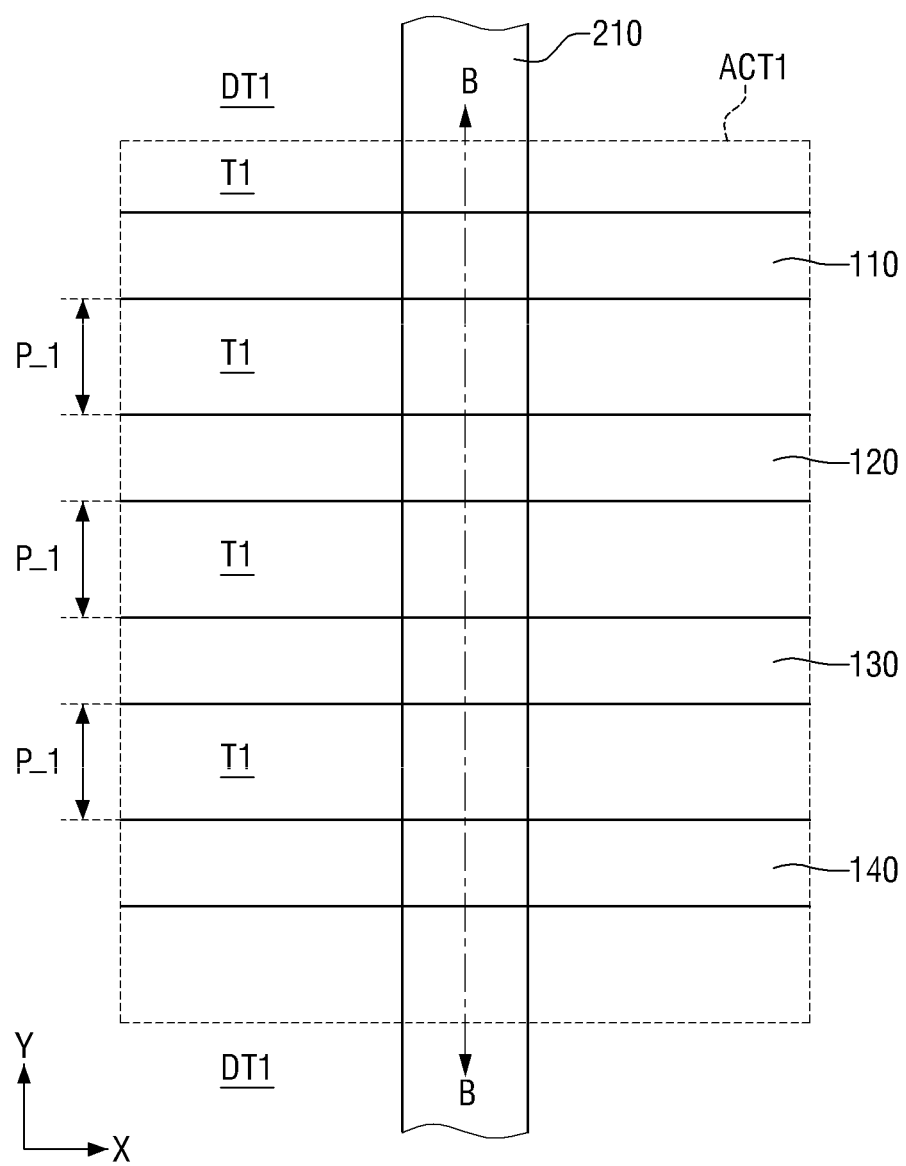
FIG. 17 is a layout view of a semiconductor device according to example embodiments of inventive concepts.
Figure 18:
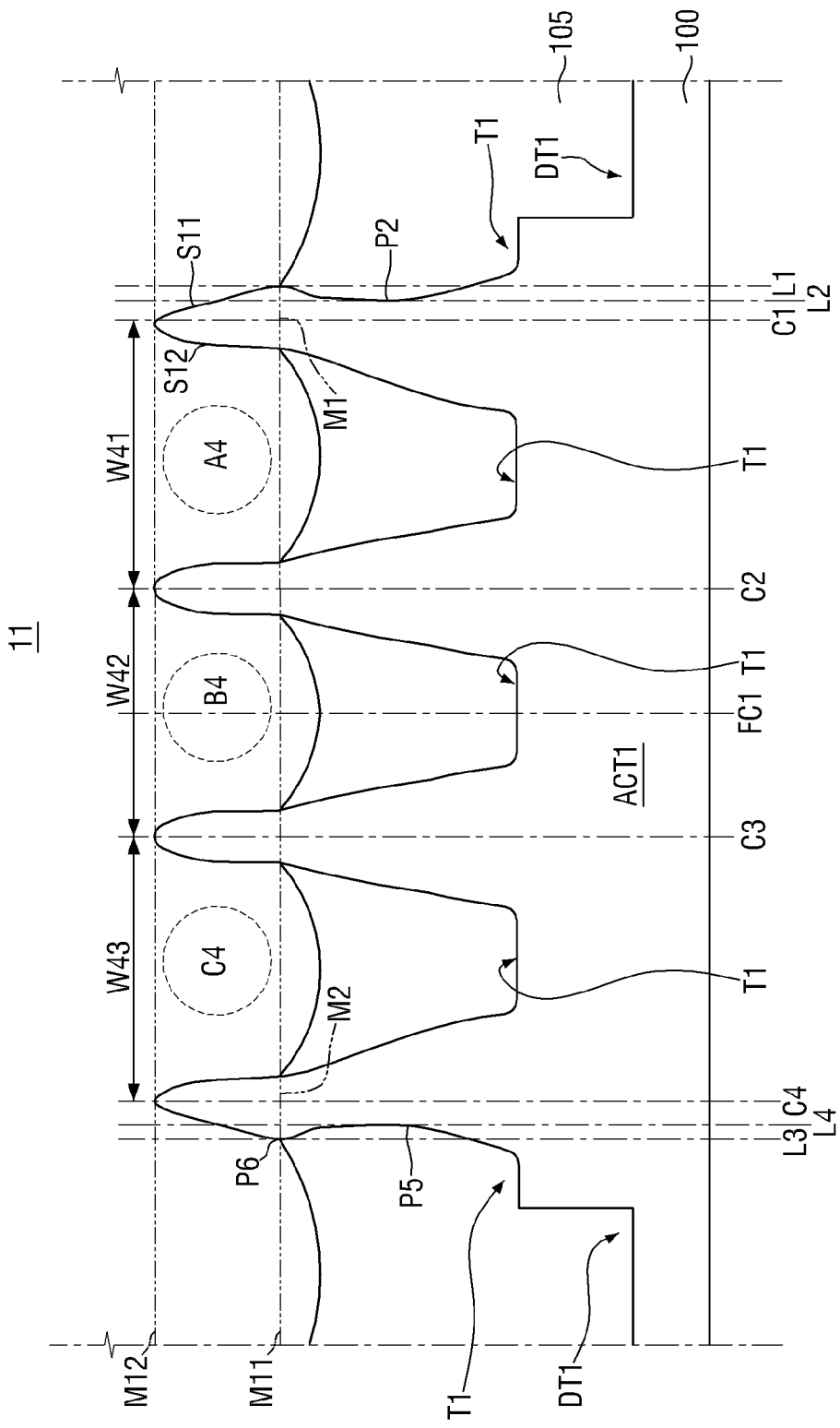
FIG. 18 is a cross-sectional view taken along the line B-B of FIG. 17.

FIG. 17 is a layout view of a semiconductor device 11 according to example embodiments of inventive concepts. FIG. 18 is a cross-sectional view taken along the line B-B of FIG. 17. For simplicity, a redundant description of elements identical to those previously described will be omitted and the description will focus mainly on the differences compared to previously-described elements.

Referring to FIGS. 17 and 18, the semiconductor device 11 according to example embodiments may include first through fourth fin patterns 110 through 140. The first through fourth fin patterns 110 through 140 may be formed in a first active region ACT1 of a substrate 100. The first active region ACT1 may be defined by a first deep trench DT1.

The first through fourth fin patterns 110 through 140 may extend along a first direction X. The first through fourth fin patterns 140 may be parallel to each other. The first through fourth fin patterns 110 through 140 may be defined by a first shallow trench T1. In addition, the first fin pattern 110 and the fourth fin pattern 140 may be adjacent to the first deep trench DT1.

The first through fourth fin patterns 110 through 140 may be arranged at equal pitches (P_1). That is, the first through fourth fin patterns 110 through 140 may be arranged at regular intervals of a first pitch P_1.

Here, each of the first fin pattern 110 and the fourth fin pattern 140 may have an asymmetrical profile as described above with reference to FIGS. 1 through 7c. On the other hand, each of the second fin pattern 120 and the third fin pattern 130 may have a symmetrical profile. Since the asymmetrical profile and the symmetrical profile have been described above in detail, a description thereof will be omitted.

Specifically, referring to FIG. 18, the first fin pattern 110 may be bent to one side. On the other hand, the fourth fin pattern 140 may be bent to the other side. The overall profiles of the first fin pattern 110 and the fourth fin pattern 140 may be symmetrical to each other.

The first fin pattern 110 may include a first boundary line M1 between an upper part of the first fin pattern 110 and a lower part of the first fin pattern 110. In addition, the first fin pattern 110 may include a first fin central line C1 which is orthogonal to the first boundary line M1 and meets a highest part P0 of the first fin pattern 110.

Likewise, the second fin pattern 120 may include a second fin central line C2 which is parallel to the first fin central line C1 and meets a highest part of the second fin pattern 120. The third fin pattern 130 may include a third fin central line C3 which is parallel to the first fin central line C1 and meets a highest part of the third fin pattern 130. The fourth fin pattern 140 may include a fourth fin central line C4 which is parallel to the first fin central line C1 and meets a highest part of the fourth fin pattern 140.

A first field central line FC1 may be defined between the second fin central line C2 and the third fin central line C3 and at a location separated from the second fin central line C2 and the third fin central line C3 by equal distances. Here, the first fin pattern 110 and the fourth fin pattern 140 may be symmetrical to each other with respect to the first field central line FC1, but inventive concepts are not limited thereto.

In addition, a first gap W41 between the first fin central line C1 and the second fin central line C2 may be different from a second gap W42 between the second fin central line C2 and the third fin central line C3. On the other hand, the first gap W41 between the first fin central line C1 and the second fin central line C2 may be equal to a third gap W43 between the third fin central line C3 and the fourth fin central line C4. This is because each of the first fin pattern 110 and the fourth fin pattern 140 has a profile bent outwards of the first active region ACT1. However, inventive concepts are not limited thereto.

Additionally, a first area A4 between the upper part of the first fin pattern 110 and an upper part of the second fin pattern 120 may be different from a second area B4 between the upper part of the second fin pattern 120 and an upper part of the third fin pattern 130. On the other hand, the first area A4 between the upper part of the first fin pattern 110 and the upper part of the second fin pattern 120 may be substantially equal to a third area C4 between the upper part of the third fin pattern 130 and an upper part of the fourth fin pattern 140. For example, the first area A4 may be, but is not limited to, larger than the second area B4.

As shown in FIG. 18, the sidewalls of the lower parts of the first fin pattern 110 and the fourth fin pattern 140 that are farthest from the first field central line FC1, indicated by points P2 and P5 respectively, may have concave sidewalls. The sidewalls of the lower parts of the first fin pattern 110 and the fourth fin pattern 140 that are closer to the first field central line FC1 may have tilted (and/or convex) sidewalls. The lower portions of the second fin pattern 120 and third fin pattern 130 do not include concave sidewalls. The lower portion of the third fin pattern 130 is symmetrical about the third fin central line C3. The lower portion of the second fin pattern 120 is symmetrical about the second fin central line C2.

Figure 19:
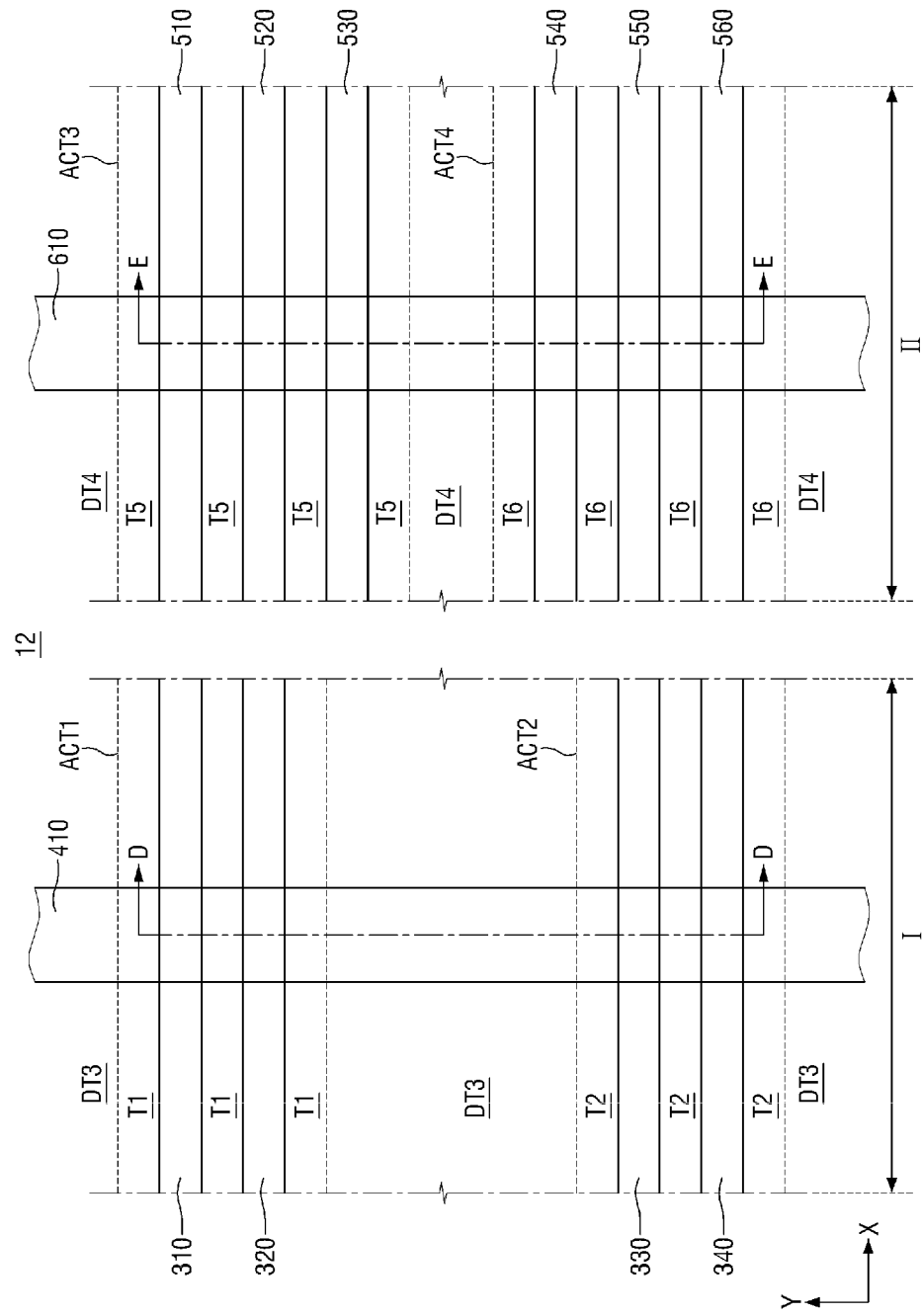
FIG. 19 is a layout view of a semiconductor device according to example embodiments of inventive concepts.
Figure 20A:
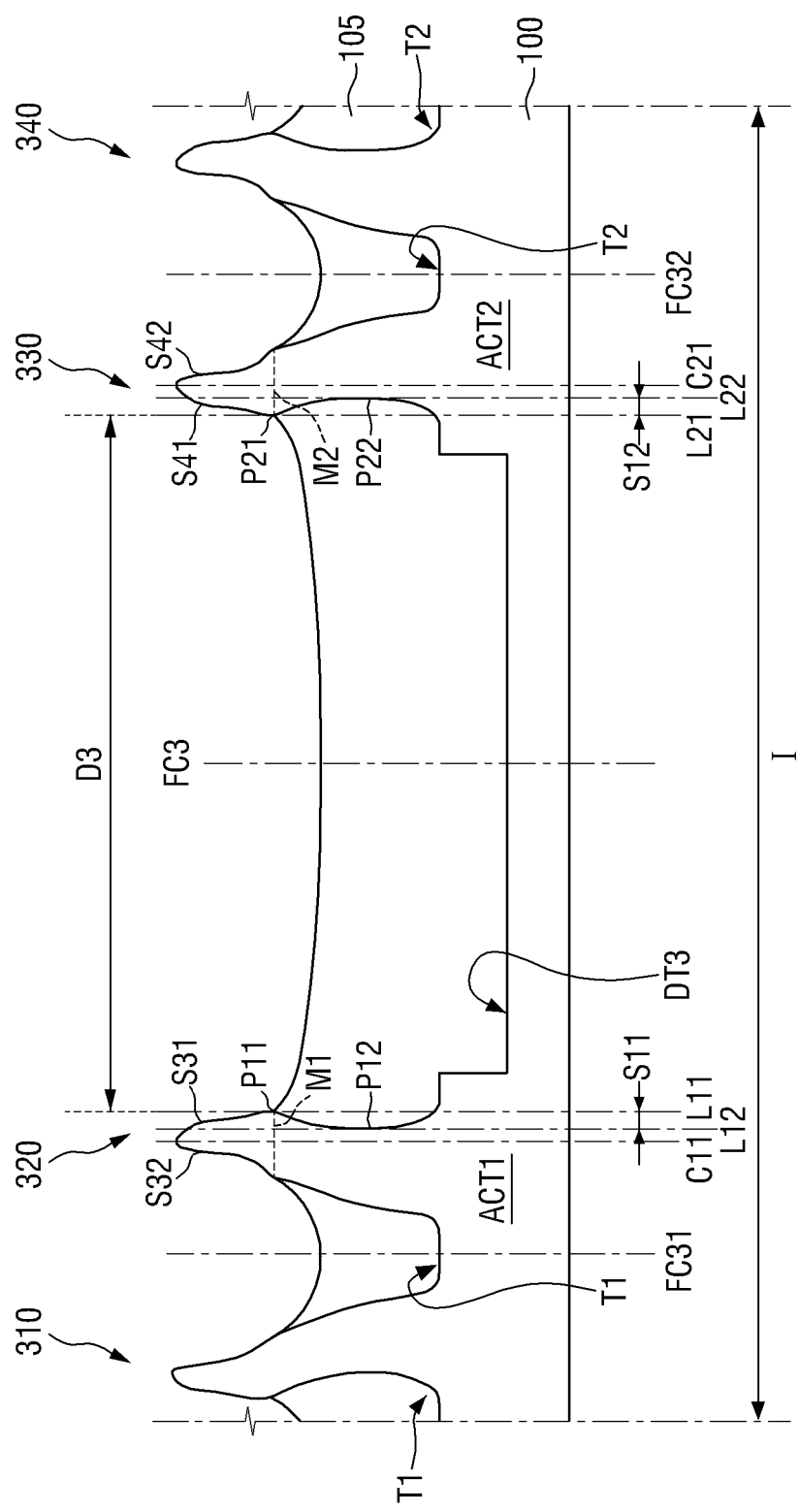
FIG. 20a is a cross-sectional view taken along the line D-D of FIG. 19.
Figure 20B:
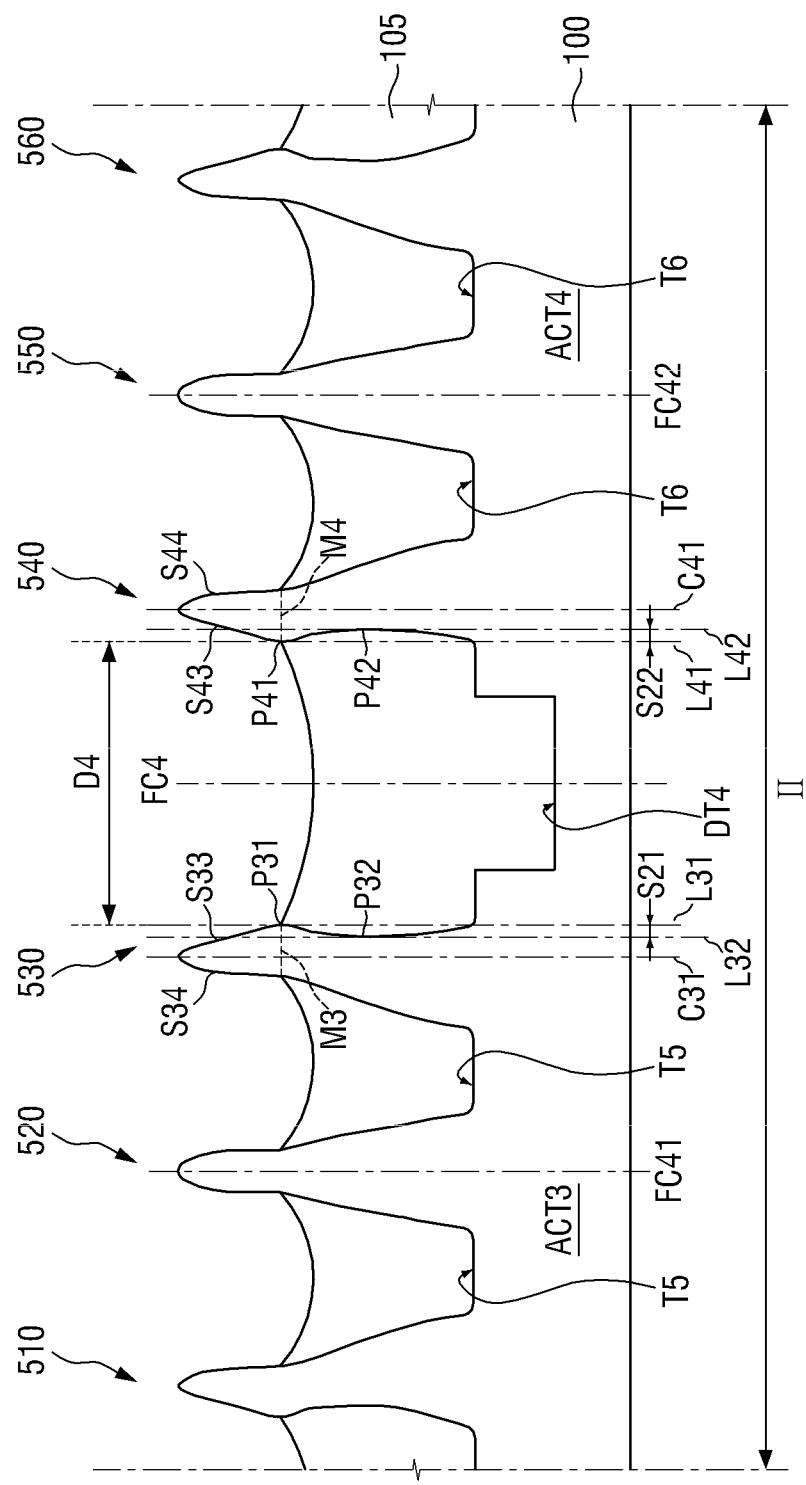
FIG. 20b is a cross-sectional view taken along the line E-E of FIG. 19.

FIG. 19 is a layout view of a semiconductor device 12 according to example embodiments of inventive concepts. FIG. 20a is a cross-sectional view taken along the line D-D of FIG. 19. FIG. 20b is a cross-sectional view taken along the line E-E of FIG. 19. For simplicity, a redundant description of elements identical to those previously described will be omitted and the description will focus mainly on the differences compared to previously-described elements. In addition, FIGS. 20a and 20b illustrate fin patterns and a field insulating layer 105 only, excluding a first gate electrode 410 and a second gate electrode 610.

Referring to FIGS. 19 through 20b, a substrate of the semiconductor device 12 according to example embodiments includes a first area I and a second area II. The first area I may include first and second active regions ACT1 and ACT2, the first gate electrode 410, a first fin pattern 310, a second fin pattern 320, a third fin pattern 330, and a fourth fin pattern 340. The second area II may include third and fourth active regions ACT3 and ACT4, the second gate electrode 610, a first fin pattern 510, a second fin pattern 520, a third fin pattern 530, a fourth fin pattern 540, a fifth fin pattern 550, and a sixth fin pattern 560. A fin central line FC41 extends from a highest part of the second fin pattern 520 to a base of the second fin pattern 520. A fin central line FC42 extends from a highest part of the fourth fin pattern 540 to a base of the fourth fin pattern 540.

The first gate electrode 410 may traverse the first active region ACT1 and the second active region ACT2. The second gate electrode 610 may traverse the third active region ACT3 and the fourth active region ACT4. Here, the first gate electrode 410 and the second gate electrode 610 may be, but are not limited to, parallel to each other.

Referring to FIGS. 19 and 20a, the first active region ACT1 and the second active region ACT2 may be separated from each other and defined by a third trench DT3 of a third depth.

The first active region ACT1 may include the first fin pattern 320 and a first shallow trench T1. The first shallow trench T1 may define the first fin pattern 310 and the second fin pattern 320 in the first active region ACT1 and may be formed to a first depth smaller than the third depth.

Likewise, the second active region ACT2 may include the third fin pattern 330, a fourth fin pattern 340, and a second shallow trench T2. The second shallow trench T2 may define the second fin pattern 320 and a third fin pattern 330 in the second active region ACT2 and may be formed to a second depth smaller than the third depth. However, inventive concepts are not limited thereto, and the third trench DT3 may be equal to the first and second depths of the first and second shallow trenches T1 and T2. The second fin pattern 320 and the third fin pattern 330 may be most adjacent to the third trench DT3.

The first gate electrode 410 may intersect the first fin pattern 310, the second fin pattern 320, the third fin pattern 330, and the fourth fin pattern 340. The field insulating layer 105 may fill part of the third trench DT3, part of the first shallow trench T1, and part of the second shallow trench T2.

The first fin pattern 310 and second fin pattern 320 may have an asymmetrical profile described above. Specifically, the second fin pattern 320 includes a lower part which is surrounded by the field insulating layer 105, an upper part which is surrounded by the first gate electrode 410, a first boundary line M1 which divides the lower part and the upper part of the first fin pattern 320, and a first fin central line C11 which is orthogonal to the first boundary line M1 and meets a highest part of the upper part of the first fin pattern 320. Here, the second fin pattern 320 may include a first point P11 and a second point P12 on a first sidewall S31 which meet a straight line parallel to the first fin central line C11. The second point P12 may be located under the first point P11 and closer to the first fin central line C11 than the first point P11. A first line L11 and a second line L12 parallel to the first fin central line C11 may be drawn. Here, the second line L12 may be disposed closer to the first fin central line C11 than the first line L11. In addition, the first line L11 and the second line L12 may be separated by a first gap S11.

Likewise, the third fin pattern 330 may have an asymmetrical profile described above. The third fin pattern 330 may include a second fin central line C21 which is parallel to the first fin central line C11 and meets a highest part of the third fin pattern 330.

A first field central line FC3 may be defined between the first fin central line C11 and the second fin central line C21 and at a location separated from the first fin central line C11 and the second fin central line C21 by equal distances. The first field central line FC3 corresponds to a center of the third trench DT3.

The second fin pattern 320 and the third fin pattern 330 may be symmetrical to each other with respect to the first field central line FC3.

Referring to FIGS. 19 and 20b, the third active region ACT3 and the fourth active region ACT4 may be separated from each other and defined by a fourth trench DT4 of a fourth depth. The depth of the fourth trench DT4 may be, but is not limited to, substantially equal to that of the third trench DT3.

The third active region ACT3 may include the first fin pattern 510, second fin pattern 520, third fin pattern 530, and a fifth shallow trench T5. The fifth shallow trench T5 may define first fin pattern 510, second fin pattern 520, and the third fin pattern 530 in the third active region ACT3 and may be formed to a fifth depth smaller than the fourth depth.

Likewise, the fourth active region ACT4 may include the fourth fin pattern 540, fifth fin pattern 550, and sixth fin pattern 560, and a sixth shallow trench T6. The sixth shallow trench T6 may define the fourth fin pattern 540, fifth fin pattern 550, and sixth fin pattern 560 in the fourth active region ACT4 and may be formed to a sixth depth smaller than the fourth depth. However, inventive concepts are not limited thereto, and the fourth trench DT4 may be equal to the fifth and sixth depths.

The third fin pattern 530 and the fourth fin pattern 540 may be most adjacent to the fourth trench DT4.

The second gate electrode 610 may intersect the third fin pattern 530 and the fourth fin pattern 540. The field insulating layer 105 may fill part of the fourth trench DT4, part of the fifth shallow trench T5, and part of the sixth shallow trench T6.

The third fin pattern 530 may have an asymmetrical profile described above. Specifically, the third fin pattern 530 includes a lower part which is surrounded by the field insulating layer 105, an upper part which is surrounded by the second gate electrode 610, a third boundary line M3 which divides the lower part and the upper part of the third fin pattern 530, and a third fin central line C31 which is orthogonal to the third boundary line M3 and meets a highest part of the upper part of the third fin pattern 530. Here, the third fin pattern 530 may include a third point P31 and a fourth point P32 on a third sidewall S33 which meet a straight line parallel to the third fin central line C31. The fourth point P32 may be located under the third point P31 and closer to the third fin central line C31 than the third point P31. A third line L31 and a fourth line L32 parallel to the third fin central line C31 may be drawn. Here, the fourth line L32 may be disposed closer to the third fin central line C31 than the third line L31. In addition, the third line L31 and the fourth line L32 may be separated by a second gap S21.

Likewise, the fourth fin pattern 540 may have an asymmetrical profile described above. The fourth fin pattern 540 may include a fourth fin central line C41 which is parallel to the third fin central line C31 and meets a highest part of the fourth fin pattern 540.

A second field central line FC4 may be defined between the third fin central line C31 and the fourth fin central line C41 and at a location separated from the third fin central line C31 and the fourth fin central line C41 by equal distances. The second field central line FC4 corresponds to a center of the fourth trench DT4.

The third fin pattern 530 and the fourth fin pattern 540 may be symmetrical to each other with respect to the second field central line FC4.

Here, the first gap S11 between the first line L11 and the second line L12 of the second fin pattern 320 may be different from the second gap S21 between the third line L31 and the fourth line L32 of the third fin pattern 530. For example, the first gap S11 may be greater than the second gap S21. This is because the second fin pattern 320 is bent to a greater degree than the third fin pattern 530. Likewise, the third fin pattern 330 may be bent to a greater degree than the fourth fin pattern 540.

Additionally, a third gap D3 between the second fin pattern 320 and the third fin pattern 330 may be greater than a fourth gap D4 between the third fin pattern 530 and the fourth fin pattern 540.

The degree to which each of the second fin pattern 320 and the third fin pattern 330 is bent may vary in proportion to the area of the field insulating layer 105 disposed between the second fin pattern 320 and the third fin pattern 330. Likewise, the degree to which each of the third fin pattern 530 and the fourth fin pattern 540 is bent may vary in proportion to the area of the field insulating layer 105 disposed between the third fin pattern 530 and the fourth fin pattern 540.

For example, when the third gap D3 between the second fin pattern 320 and the third fin pattern 330 is greater than the fourth gap D4 between the third fin pattern 530 and the fourth fin pattern 540 as described above with reference to FIGS. 20A and 20B, the second fin pattern 320 may be bent to a greater degree than the third fin pattern 530. Accordingly, the first gap S11 between the first line L11 and the second line L12 of the first fin pattern 320 may be greater than the second gap S21 between the third line L31 and the fourth line L32 of the third fin pattern 530. However, inventive concepts are not limited thereto.

Figure 21:
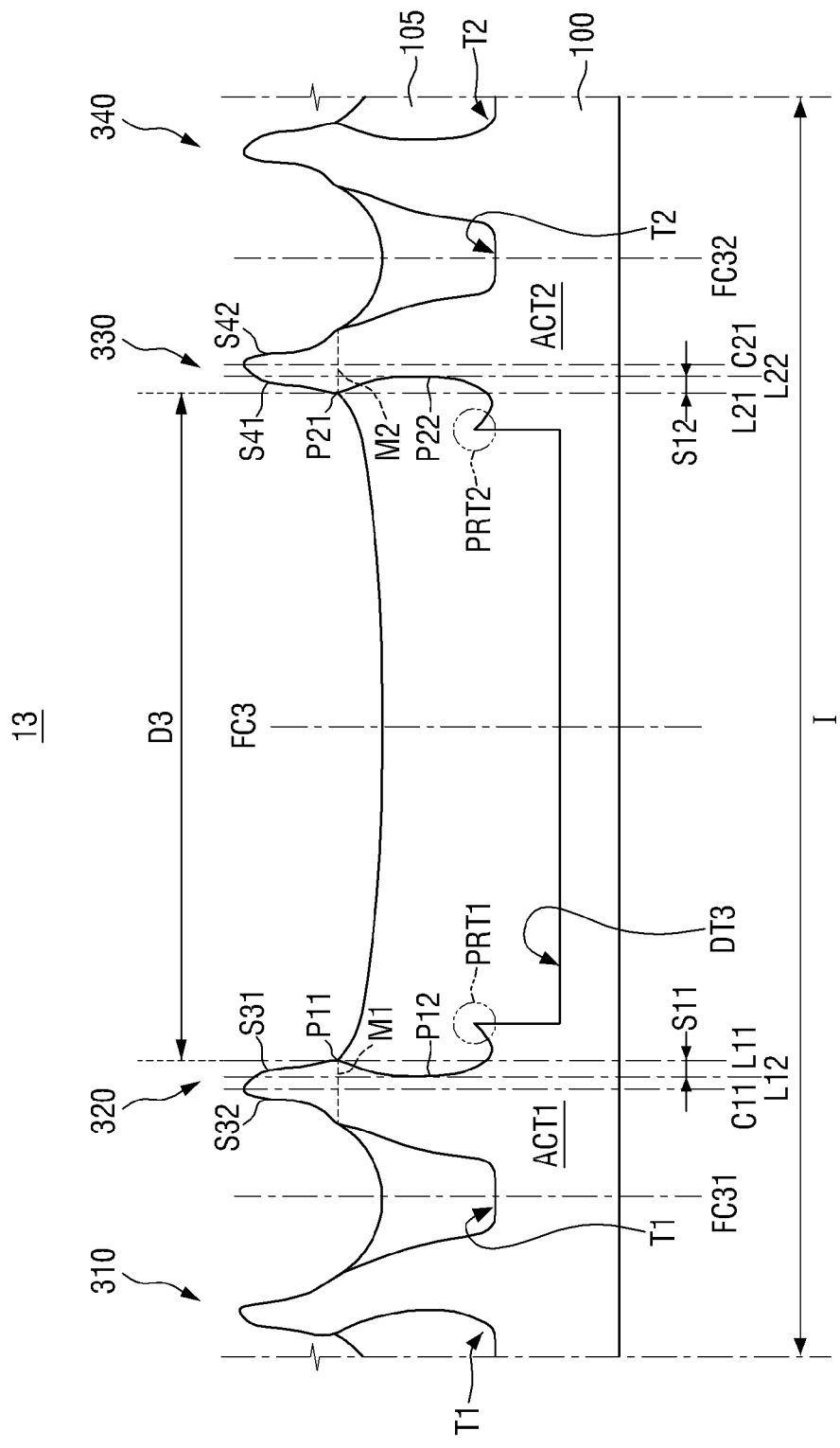
FIG. 21 is a cross-sectional view of a semiconductor device according to example embodiments of inventive concepts.

FIG. 21 is a cross-sectional view of a semiconductor device 13 according to example embodiments of inventive concepts. In addition, FIG. 21 is a cross-sectional view taken along the line D-D of FIG. 19. For simplicity, a redundant description of elements identical to those previously described will be omitted and the description will focus mainly on the differences compared to previously-described elements. Referring to FIG. 21, the semiconductor device 13 according to example embodiments may further include first and second protrusion structures PRT1 and PRT2. For example, the first and second protrusion structures PRT1 and PRT2 may be located on a side of a second fin pattern 320 and the other side of a third fin pattern 330, respectively.

Specifically, the first protrusion structure PRT1 may protrude from a bottom of a first shallow trench T1 and may be formed lower than an upper surface of a field insulating layer 105. The first protrusion structure PRT1 may be located at a boundary between a third trench DT3 and the first shallow trench T1.

In addition, the second protrusion structure PRT2 may protrude from a bottom of a second shallow trench T2 and may be formed lower than the upper surface of the field insulating layer 105. The second protrusion structure PRT2 may be located at a boundary between the third trench DT3 and the second shallow trench T2.

Although not specifically illustrated in the drawing, a protrusion structure may also be formed at a boundary between a fourth trench DT4 and a fifth shallow trench T5 and at a boundary between the fourth trench DT4 and a sixth trench T5. However, inventive concepts are not limited thereto.

Figure 22:
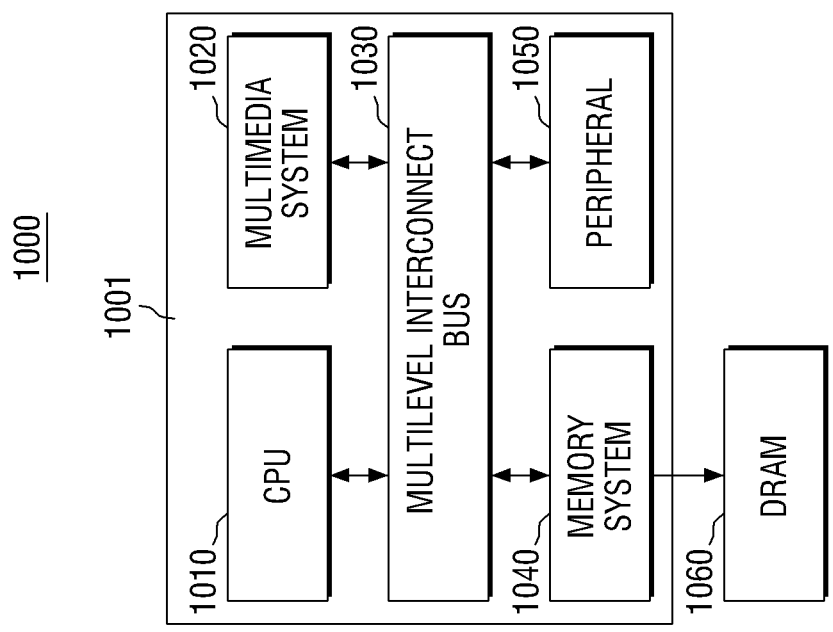
FIG. 22 is a block diagram of a system-on-chip (SoC) system including semiconductor devices according to example embodiments of inventive concepts.

FIG. 22 is a block diagram of a system-on-chip (SoC) system 1000 including semiconductor devices according to example embodiments of inventive concepts.

Referring to FIG. 22, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations for driving the SoC system 1000. In example embodiments, the CPU 1010 may be configured as a multi-core environment including a plurality of cores.

The multimedia system 1020 may be used to perform various multimedia functions in the SoC system 1000. The multimedia system 1020 may include a 3D engine module, a video codec, a display system, a camera system, and a post-processor.

The bus 1030 may be used for data communication among the CPU 1010, the multimedia system 1020, the memory system 1040 and the peripheral circuit 1050. In example embodiments, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In example embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as a working memory needed for the operation of the application processor 1001. In example embodiments, the DRAM 1060 may be placed outside the application processor 1001 as illustrated in the drawing. Specifically, the DRAM 1060 may be packaged with the application processor 1001 in the form of package on package (PoP).

At least one of the elements of the SoC system 1000 may employ any one of the above-described semiconductor devices according example embodiments of inventive concepts.

In addition, the SoC system 1000 described above may be applied to nearly all types of electronic products capable of transmitting and/or receiving information in a wireless environment, such as a personal data assistant (PDA), a portable computer, a web tablet, a wireless phone, a mobile phone, a digital music player, a memory card, etc.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A semiconductor device comprising:
    a substrate including a first trench;
    a first fin pattern on the substrate,
        the first fin pattern including a first sidewall and a second sidewall facing each other,
        the first fin pattern being defined by the first trench,
        the first fin pattern including an upper part on a lower part,
        a first boundary line divides the lower part and the upper part of the first fin pattern,
        a first fin central line is orthogonal to the first boundary line and meets a highest part of the upper part of the first fin pattern,
        a first distance between the first sidewall and the first fin central line is measured at a first height from a lower surface of the first trench, the first height corresponding to a vertical distance between the lower surface of the first trench and a first point along the first sidewall,
        a second distance between the first sidewall and the first fin central line is measured at a second height lower than the first height, the second height corresponding to a second point along the first sidewall between the first point and the lower surface of the first trench,
        the first distance is greater than the second distance,
        a third distance between the second sidewall and the first fin central line is measured at the first height,
        a fourth distance between the second sidewall and the first fin central line is measured at the second height,
        the third distance is smaller than the fourth distance;
    a gate electrode on the substrate, the gate electrode intersecting the first fin pattern,
        the upper part of the first fin pattern being surrounded by the gate electrode; and
    a field insulating layer on the substrate surrounding part of the first fin pattern,
        the lower part of the first fin pattern being surrounded by the field insulating layer.

2. The semiconductor device of claim 1, wherein
    the first height and the second height are lower than a height from the lower surface of the first trench to the first boundary line,
    the first distance and the second distance are smaller than a fifth distance between the first sidewall and the first fin central line that is measured on the first boundary line.

3. The semiconductor device of claim 1, wherein a distance between the first fin central line and the first sidewall of the upper part of the first fin pattern is reduced as a distance from the first boundary line increases.

4. The semiconductor device of claim 1, wherein the first fin central line contacts the first sidewall.

5. The semiconductor device of claim 1, further comprising:
    a protrusion structure that protrudes from a bottom surface of the first trench adjacent to the first sidewall.

6. The semiconductor device of claim 1, wherein
    the first trench includes a first sub-trench and a second sub-trench, the first sub-trench contacts the first sidewall,
    the second sub-trench contacts the second sidewall, and
    an upper surface of the first sub-trench lies in a different plane from an upper surface of the second sub-trench.

7. The semiconductor device of claim 6, wherein a height of the first sub-trench from the substrate is lower than that of the second sub-trench.

8. The semiconductor device of claim 1, further comprising:
    a liner that surrounds the lower part of the first fin pattern.

9. The semiconductor device of claim 1, further comprising:
    a second fin pattern on the substrate adjacent to the first trench, the second fin pattern including a third sidewall and a fourth sidewall facing each other, wherein
    the substrate includes a second trench adjacent to the first sidewall of the first fin pattern and the fourth sidewall of the second fin pattern,
    the field insulating layer fills part of the first trench and part of the second trench,
    the second fin pattern includes an upper part on a lower part,
    the lower part of the second fin pattern is surrounded by the field insulating layer,
    the upper part of the second fin pattern is surrounded by the gate electrode,
    the second fin pattern includes a second boundary line that divides the lower part and the upper part of the second fin pattern, and
    the second fin pattern includes a second fin central line that is orthogonal to the second boundary line and meets a highest part of the upper part of the second fin pattern, a third distance between the fourth sidewall and the second fin central line is measured at the first height.

10. A semiconductor device comprising:
a first fin pattern including a first sidewall and a second sidewall facing each other,
the first fin pattern including an upper part on a lower part,
the first fin pattern including a first boundary line that divides the lower part and the upper part,
the first fin pattern including a first fin central line that is orthogonal to the first boundary line and meets a highest part of the upper part of the first fin pattern,
a first line being parallel to the first fin central line and contacts a first point along the first sidewall,
a second line is parallel to the first fin central line and contacts a second point along the first sidewall,
the second line being closer to the first fin central line than the first line, and
the second point being located under the first point;
a gate electrode on the first fin pattern, the gate electrode intersecting the first fin pattern,
the gate electrode surrounding the upper part of the first fin pattern;
a field insulating layer contacting part of the first fin pattern,
the field insulating layer surrounding the lower part of the first fin pattern;
a substrate including a first trench that defines the first fin pattern; and
a protrusion structure that protrudes from a bottom surface of the first trench adjacent to the first sidewall.

11. The semiconductor device of claim 10, wherein the first fin central line is located further outwards of the first fin pattern than the first line and the second line.

12. The semiconductor device of claim 10, further comprising:
a substrate including a first trench; and
a second fin pattern including a third sidewall and a fourth sidewall facing each other, wherein
the first fin pattern is defined by the first trench,
the second fin pattern is adjacent to the first fin pattern,
the first trench is between the second sidewall of the first fin pattern and the third sidewall of the second fin pattern which face each other,
the second fin pattern includes an upper part on a lower part,
the field insulating layer surrounds the lower part of the second fin pattern,
the gate electrode surrounds the upper part of the second fin pattern,
a second boundary line divides the upper and lower parts of the second fin pattern,
a second fin central line is orthogonal to the second boundary line and meets a highest part of the upper part of the second fin pattern,
a third line is parallel to the second fin central line and contacts a third point along the fourth sidewall, and a fourth line which are parallel to the second fin central line and contacts a fourth point along the fourth sidewall,
the third line is closer to the second fin central line than the fourth line, and
the fourth point is located under the third point.

13. The semiconductor device of claim 12, wherein
the second sidewall of the first fin pattern and the third sidewall of the second fin pattern face each other with the field insulating layer therebetween,
a field central line is defined between the first fin central line and the second fin central line and at a location separated from the first fin central line and the second fin central line by equal distances, and
the second sidewall and the third sidewall are symmetrical to each other with respect to the field central line.

14. A semiconductor device comprising:
a substrate including a first trench;
a first fin pattern on the substrate,
the first fin pattern being defined by the first trench,
the first fin pattern including an upper part on a lower part,
the first fin pattern including a first sidewall and a second sidewall opposite each other,
the first sidewall being concave along the lower part of the first fin pattern,
the second sidewall being tilted along the lower part of the first fin pattern;
a field insulating layer on the substrate, the field insulating layer surrounding the lower part of the first fin pattern; and
a gate electrode on the substrate, the gate electrode surrounding the upper part of the first fin pattern, wherein
the upper part and lower part of the first fin pattern are defined based on a horizontal distance between a first fin central line and the first and second sidewalls of the first fin pattern, a first point along the first sidewall, and a second point along the first sidewall,
the first fin central line extends vertically from a highest part of the first fin pattern to a lowest part of the first fin,
the first point is along the first sidewall between the highest part of the first fin pattern and the second point,
the second point is along the first sidewall between first point and a lowest part of the first fin pattern,
the horizontal distance between the first fin central line and the first sidewall decreases along the first sidewall from the first point to the highest part of the first fin pattern,
the horizontal distance between the first fin central line and the first sidewall increases along the first sidewall from the second point to the first point, and
the horizontal distance between the first fin central line and the first sidewall increases along the first sidewall from the second point to the lowest part of the first fin pattern.

15. The semiconductor device of claim 14, wherein
the substrate includes a deep trench that defines an active pattern,
the first trench is formed in the active pattern such that the first trench defines the first fin on the active pattern, and
an upper surface of the active pattern at a bottom of the first trench is above a bottom surface of the deep trench.

16. The semiconductor device of claim 15, wherein
the first trench defines a plurality of fin patterns spaced apart from each other on the active pattern,
the plurality of fin patterns include an outer fin pattern spaced apart from the first fin pattern,
the plurality of fin patterns include the first fin pattern, and
the outer fin pattern is symmetrical to the first fin pattern with respect to a first field central line that divides the active pattern and extends vertically through the active pattern.

17. The semiconductor device of claim 14, wherein
a first boundary line divides the lower part and the upper part of the first fin pattern, a first fin central line is orthogonal to the first boundary line and meets a highest part of the upper part of the first fin pattern, and the lower part of the first fin pattern is asymmetrical about the first fin central line.

* * * * *